US011418175B1

(12) United States Patent
Liles et al.

(10) Patent No.: US 11,418,175 B1
(45) Date of Patent: Aug. 16, 2022

(54) RECIPROCAL QUANTUM LOGIC INVERTER

(71) Applicant: Microsoft Technology Licensing, LLC, Redmond, WA (US)

(72) Inventors: Stephen E. Liles, Apex, NC (US); Kirti N. Bhanushali, Apex, NC (US); John R. Bordelon, Durham, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/238,600

(22) Filed: Apr. 23, 2021

(51) Int. Cl.
*H03K 19/195* (2006.01)
*H03K 3/38* (2006.01)
*H02M 3/335* (2006.01)
*H01L 39/22* (2006.01)
*H01L 39/02* (2006.01)

(52) U.S. Cl.
CPC ............ *H03K 3/38* (2013.01); *H01L 39/025* (2013.01); *H01L 39/223* (2013.01); *H02M 3/33576* (2013.01); *H03K 19/195* (2013.01)

(58) Field of Classification Search
CPC .............. H01L 39/025; H01L 39/223; H02M 3/33576; H03K 3/38; H03K 19/195
See application file for complete search history.

(56) References Cited

U.S. PATENT DOCUMENTS 5,872,731 A * 2/1999 Chan ..................... G11C 11/44
365/832
6,483,339 B1 * 11/2002 Durand ............... H03K 19/1952
327/368
9,588,191 B1 * 3/2017 Kornev ................. H01L 39/223
10,452,991 B1 * 10/2019 Ganzhorn .............. B82Y 10/00
11,054,598 B1 * 7/2021 Yap .......................... G02B 6/43
(Continued)

OTHER PUBLICATIONS

Oberg, O.T., "Superconducting Logic Circuits Operating with Reciprocal Magnetic Flux Quanta," Dissertation submitted to the Faculty of the Graduate School of the University of Maryland, College Park in partial fulfillment of the requirements for the degree of Doctor of Philosophy, 2011, available at https://drum.lib.umd.edu/bitstream/handle/1903/12338/Oberg_umd_0117E_12789.pdf;sequence=1, 337 pages.
(Continued)

*Primary Examiner* — Kurtis R Bahr
(74) *Attorney, Agent, or Firm* — Withrow & Terranova, P.L.L.C.

(57) ABSTRACT

The present disclosure relates to a reciprocal quantum logic (RQL) inverter including an inverter bias tap, a pulse generating Josephson junction (JJ), and a superconducting quantum interference device (SQUID) based structure, which includes a SQUID JJ and is connected between the inverter bias tap and the pulse generating JJ. The SQUID based structure is configured to receive an inverter bias signal from the inverter bias tap and receive a data input from a previous circuit stage. When the data input is at logic state "0," the pulse generating JJ can be triggered so as to provide an output signal with logic state "1." When the data input is at logic state "1," the first SQUID JJ can be triggered thereby preventing the pulse generating JJ from be triggered, such that the output signal is provided at logic state "0."

22 Claims, 14 Drawing Sheets

(56) References Cited

U.S. PATENT DOCUMENTS

| | | | |
|---|---|---|---|
| 2001/0025012 A1* | 9/2001 | Tarutani | H03K 19/1952 |
| | | | 505/100 |
| 2016/0221825 A1* | 8/2016 | Allen | F01K 13/00 |
| 2019/0245544 A1 | 8/2019 | Herr | |
| 2020/0044656 A1 | 2/2020 | Herr et al. | |
| 2020/0090738 A1* | 3/2020 | Naaman | G11C 11/1675 |
| 2020/0220064 A1* | 7/2020 | Graninger | H01L 22/12 |
| 2020/0411937 A1* | 12/2020 | Whittaker | H03H 2/005 |
| 2022/0065954 A1* | 3/2022 | Beck | H01L 39/223 |

OTHER PUBLICATIONS

Harada, et al., "Quantum Flux Parametron", In Proceedings of the International Electron Devices Meeting, Dec. 6, 1987, 5 Pages.

"International Search Repod and Written Opinion Issued in PCT Application No. PCT/US22/17737", dated Jun. 17, 2022, 16 Pages.

\* cited by examiner

RECIPROCAL QUANTUM LOGIC INVERTER

FIELD OF THE DISCLOSURE

The technology of the disclosure relates to a reciprocal quantum logic (RQL) inverter, and more particularly to an RQL inverter having a superconducting quantum interference device (SQUID)-based structure in series with a pulse generator.

BACKGROUND

In digital circuits and systems, complimentary metal-oxide semiconductor (CMOS) technology is widely used due to its high noise immunity and relatively low static power consumption. However, the power consumption has gradually become a limiting factor in superior high-speed digital circuits based on the CMOS technology. Reciprocal quantum logic (RQL) superconducting technology, which integrates the low energy and high speed of superconductor devices with the essential qualities of CMOS, has attracted more and more attention in digital circuit designs and implementations.

An inverter is one of the most extensively used blocks in digital logic implementations. FIG. 1 shows a conventional RQL inverter 10 including two pulse generating circuits 12, an input Josephson Junction (JJ) 14, two escape JJs 16, an output JJ 18, an output Josephson transmission line (JTL) buffer 20, five bias taps 22, and four inductors 24. Each pulse generating circuit 12 includes two generating inductors 26, a generating JJ 28, and a generating JTL buffer 30. Herein, the pulse generation circuits 12 are configured to generate a high output (RQL logic 1) when there is no/low data input. When the data input goes high, the data input triggers the input JJ. As a result, the flux is escaped by the escape JJs 16 and thus there is no output (RQL logic 0). Although the conventional RQL inverter 10 archives proper inversion operation with low power consumption, the occupied area of the conventional RQL inverter 10 is relatively large, resulting in a large chip area, a low circuit density, and high cost, which are some of biggest challenges in superconducting logic.

Accordingly, there is a need for a new RQL inverter design, which provides a reduced area without sacrificing correct inversion operation. In addition, it is desired to achieve the inversion operation without increasing the complexity of design and implementation.

SUMMARY

The present disclosure relates to a reciprocal quantum logic (RQL) inverter having a superconducting quantum interference device (SQUID)-based structure in series with a pulse generating Josephson junction (JJ). The disclosed RQL inverter includes an inverter bias tap providing an inverter bias signal, a pulse generating Josephson junction (JJ) connected to ground, and a SQUID based structure connected between the inverter bias tap and the pulse generating JJ. The SQUID based structure includes a first SQUID JJ and is configured to receive the inverter bias signal from the inverter bias tap and receive a data input from a previous circuit stage. The first SQUID JJ is in a loop of the SQUID based structure. Herein, when the data input is at logic state "0", the pulse generating JJ is able to be triggered and provide an output signal with a positive and negative single flux quanta (SFQ) pair within one clock cycle. When the data input is at logic state "1", the first SQUID JJ is able to be triggered and pass flux into the loop of the SQUID based structure, thereby preventing the pulse generating JJ from being triggered.

In one embodiment of the RQL inverter, the inverter bias signal leads the input data by 90° in phase.

In one embodiment of the RQL inverter, the pulse generating JJ is sized so that it is able to be triggered by the inverter bias signal alone.

In one embodiment of the RQL inverter, the SQUID based structure further includes a first transformer with a first primary winding and a first secondary winding. The first primary winding is connected between the previous circuit stage and ground, the first secondary winding and the first SQUID JJ are connected in series between the inverter bias tap and the pulse generating JJ, and the pulse generating JJ is connected between the first SQUID JJ and ground. The first SQUID JJ and the first secondary winding are in the loop of the SQUID based structure. Herein, the output signal is provided at a connection node of the pulse generating JJ and the first SQUID JJ.

According to one embodiment, the RQL inverter further includes a bias inductor, wherein the bias inductor is connected between the inverter bias tap and the first secondary winding.

According to one embodiment, the RQL inverter further includes an output bias tap and an output Josephson transmission line (JTL) buffer. The output JTL buffer is configured to receive an output bias signal from the output bias tap and propagate the output signal from the SQUID based structure to a next circuit stage.

In one embodiment of the RQL inverter, the inverter bias signal and the output bias signal are synchronized in phase.

In one embodiment of the RQL inverter, the output JTL buffer includes a first output inductor, a second output inductor, a third output inductor, a first output JJ, and a second output JJ. The first output inductor and the first output JJ are connected in series between a node of the output JTL buffer and ground, and the second output inductor and the second output JJ are connected in series between the node of the output JTL buffer and ground. The output signal from the SQUID based structure is received at a connection node of the first output inductor and the first output JJ. The third output inductor is connected between the output bias tap and the node of the output JTL buffer.

In one embodiment of the RQL inverter, the SQUID based structure is a direct current (DC) SQUID based structure. Herein, the SQUID based structure further includes a second SQUID JJ, and a second transformer with a second primary winding and a second secondary winding. The first primary winding and the second primary winding are connected in series between the previous circuit stage and ground. The second secondary winding and the second SQUID JJ are connected in series between the inverter bias tap and the pulse generating JJ, such that the first secondary winding and the first SQUID JJ are parallel with the second secondary winding and the second SQUID JJ. The first SQUID JJ, the first secondary winding, the second secondary winding, and the second SQUID JJ are in the loop of the SQUID based structure.

In one embodiment of the RQL inverter, the first SQUID JJ and the second SQUID JJ are sized so that each does not get triggered by the inverter bias signal alone.

In one embodiment of the RQL inverter, the first SQUID JJ and the second SQUID JJ are sized so that each does not get triggered by the data input alone.

In one embodiment of the RQL inverter, a combined size of the first SQUID JJ and the second SQUID JJ is larger than a size of the pulse generating JJ.

In one embodiment of the RQL inverter, the first SQUID JJ and the second SQUID JJ are sized so that the first SQUID JJ is able to be triggered by a combination of the data input and the inverter bias signal. Herein, the data input induces an induced current in the loop of the SQUID based structure. A critical current of the first SQUID JJ is smaller than a max value of the induced current plus a max value of the inverter bias signal.

In one embodiment of the RQL inverter, the first SQUID JJ, the second SQUID JJ, and the pulse generating JJ are sized so that the critical current of the first SQUID JJ minus the induced current is smaller than a critical current of the pulse generating JJ, and the critical current of the pulse generating JJ is smaller than the max value of the inverter bias signal.

In one embodiment of the RQL inverter, the SQUID based structure is a radio frequency (RF) SQUID based structure. The first SQUID JJ is the only one JJ in the loop of the SQUID based structure.

In one embodiment of the RQL inverter, the SQUID based structure further includes a SQUID inductor, and a second transformer with a second primary winding and a second secondary winding. The first primary winding and the second primary winding are connected in series between the previous circuit stage and ground. The second secondary winding and the SQUID inductor are connected in series between the inverter bias tap and the pulse generating JJ, such that the first secondary winding and the first SQUID JJ are parallel with the second secondary winding and the SQUID inductor. The first SQUID JJ, the first secondary winding, the second secondary winding, and the SQUID inductor are in the loop of the SQUID based structure.

In one embodiment of the RQL inverter, the SQUID based structure further includes a second transformer with a second primary winding and a second secondary winding. The first primary winding and the second primary winding are connected in series between the previous circuit stage and ground. The second secondary winding is connected between the inverter bias tap and the pulse generating JJ, such that the first secondary winding and the first SQUID JJ are parallel with the second secondary winding. The first SQUID JJ, the first secondary winding, and the second secondary winding are in the loop of the SQUID based structure.

In one embodiment of the RQL inverter, the SQUID based structure further includes a SQUID inductor. The SQUID inductor is connected between the inverter bias tap and the pulse generating JJ, such that the first secondary winding and the first SQUID JJ are parallel with the SQUID inductor. The first SQUID JJ, the first secondary winding, and the SQUID inductor are in the loop of the SQUID based structure.

In one embodiment of the RQL inverter, the first SQUID JJ is sized so that it does not get triggered by the inverter bias signal alone.

In one embodiment of the RQL inverter, the first SQUID JJ is sized so that it does not get triggered by the data input alone.

In one embodiment of the RQL inverter, the first SQUID JJ is sized so that the first SQUID JJ is able to be triggered by a combination of the data input and the inverter bias signal. Herein, the data input induces an induced current in the loop of the SQUID based structure, and a critical current of the first SQUID JJ is smaller than a max value of the induced current plus a max value of the inverter bias signal.

In one embodiment of the RQL inverter, the first SQUID JJ and the pulse generating JJ are sized so that the critical current of the first SQUID JJ minus the induced current is smaller than a critical current of the pulse generating JJ, and the critical current of the pulse generating JJ is smaller than the max value of the inverter bias signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
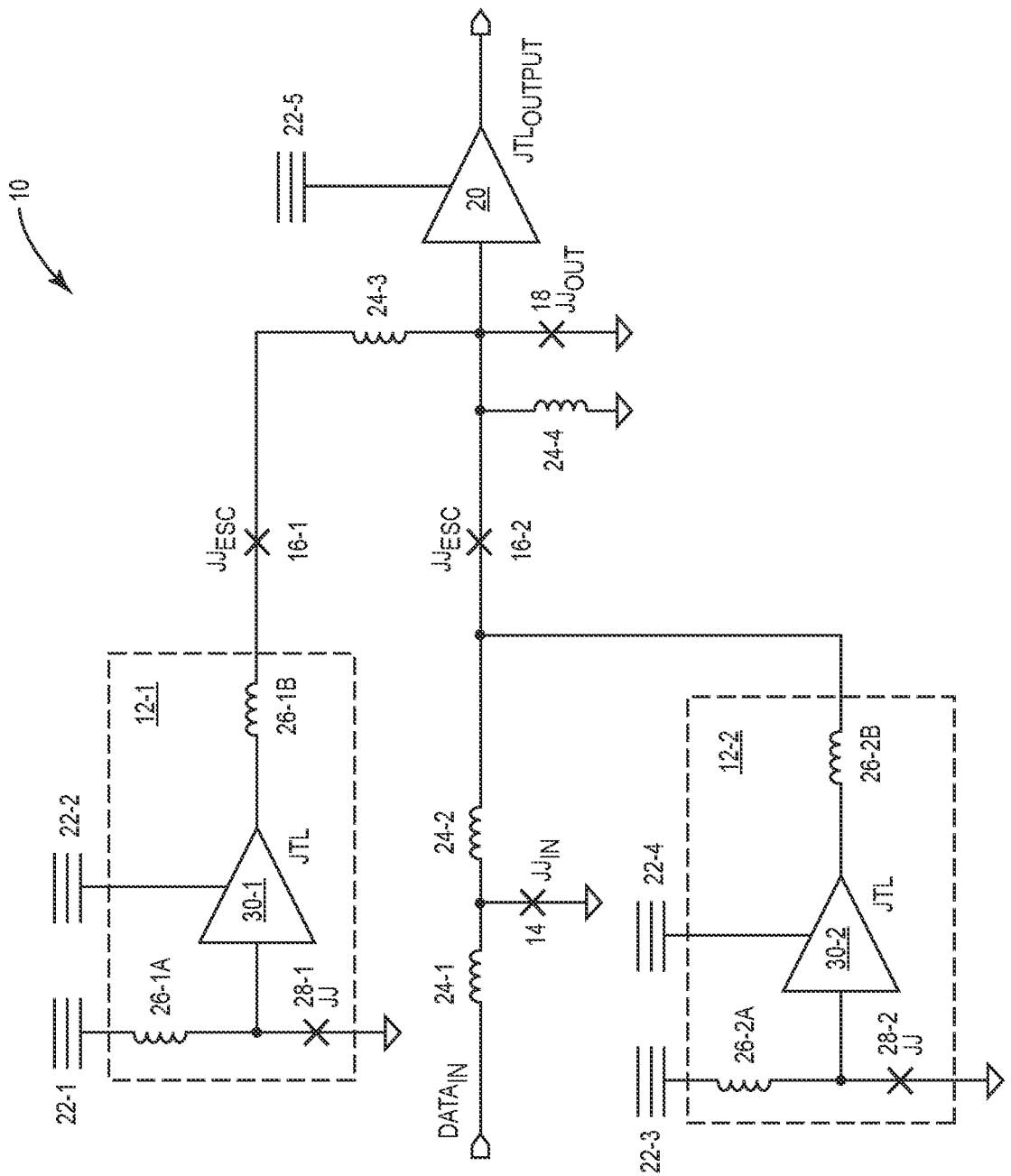
FIG. 1 illustrates a conventional reciprocal quantum logic (RQL) inverter.

It will be understood that for clear illustrations, FIGS. 1-5C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
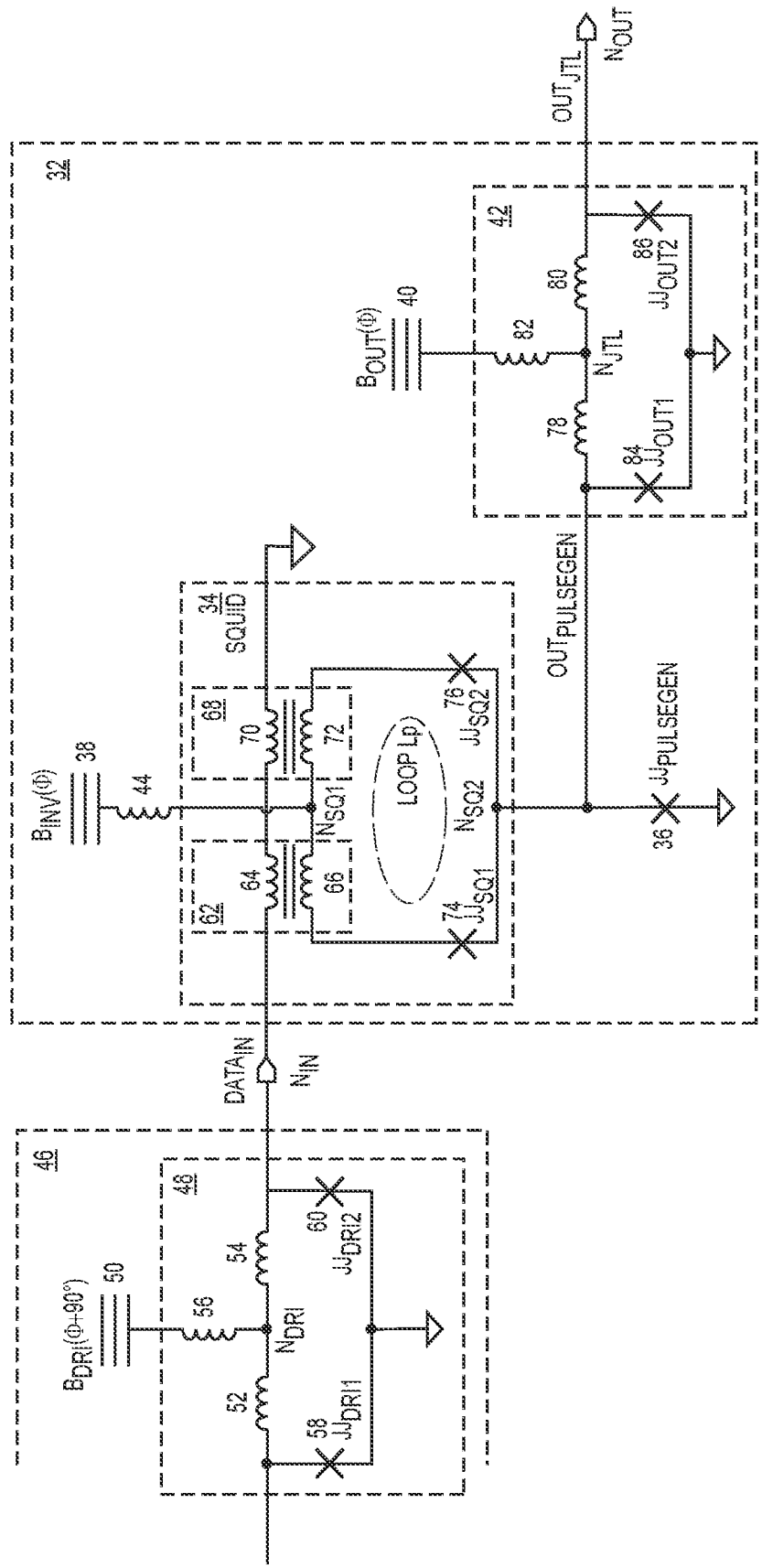
FIG. 2 illustrates an exemplary RQL inverter having a direct current (DC) superconducting quantum interference device (SQUID)-based structure in series with a pulse generator according to an embodiment of the present disclosure.

The present disclosure relates to a reciprocal quantum logic (RQL) inverter having a superconducting quantum interference device (SQUID)-based structure in series with a pulse generator. FIG. 2 shows an exemplary RQL inverter 32 having a direct current (DC) SQUID-based structure 34 in series with a pulse generator 36 according to one embodiment of the present disclosure. The pulse generator 36 is implemented by a Josephson Junction (JJ). Hereafter, the pulse generator 36 and a pulse generating $JJ_{PULSEGEN}$ 36 represent a same component and may be used alternatively. The RQL inverter 32 also includes an inverter bias tap 38 providing an inverter bias signal $B_{INV}$, an output bias tap 40 providing an output bias signal $B_{OUT}$, and an output Josephson Transmission Line (JTL) buffer 42. Each of the inverter bias signal $B_{INV}$ and the output bias signal $B_{OUT}$ is an alternating current (AC) clock with a sinusoid waveform.

In detail, the DC SQUID-based structure 34 is configured to receive the inverter bias signal $B_{INV}$ from the inverter bias tap 38 via a bias inductor 44, and configured to receive a data input $DATA_{IN}$ from a previous circuit stage 46. The previous circuit stage 46 may include an output JTL buffer 48, which is also a driving JTL buffer for the RQL inverter 32 to provide the data input $DATA_{IN}$ to the RQL inverter 32. Hereafter, the output JTL buffer 48 of the previous circuit stage 46 and the driving JTL buffer 48 for the RQL inverter 32 represent a same component and may be used alternatively. The driving JTL buffer 48 is connected to a driving bias tap 50 to receive a driving bias signal $B_{DRI}$, which is an AC clock with a sinusoid waveform. In one embodiment, the driving JTL buffer 48 includes a first driving inductor 52, a second driving inductor 54, a third driving inductor 56, a first driving $JJ_{DRI1}$ 58, and a second driving $JJ_{DRI2}$ 60. The first driving inductor 52 and the first driving $JJ_{DRI1}$ 58 are connected in series between a node $N_{DRI}$ of the driving JTL buffer 48 and ground, and the second driving inductor 54 and the second driving $JJ_{DRI2}$ 60 are also connected in series between the node $N_{DRI}$ of the driving JTL buffer 48 and ground. As such, the first driving inductor 52 and the first driving $JJ_{DRI1}$ 58 are parallel with the second driving inductor 54 and the second driving $JJ_{DRI2}$ 60 between the node $N_{DRI}$ of the driving JTL buffer 48 and ground. The first driving inductor 52 and the second driving inductor 54 are connected at the node $N_{DRI}$ of the driving JTL buffer 48, while the first driving $JJ_{DRI1}$ 58 and the second driving $JJ_{DRI2}$ 60 are connected at ground. The third driving inductor 56 is connected between the driving bias tap 50 and the node $N_{DRI}$ of the driving JTL buffer 48. The data input $DATA_{IN}$ is provided at a connection node of the second driving inductor 54 and the second driving $JJ_{DRI2}$ 60, which is connected to an input node $N_{IN}$ of the RQL inverter 32.

The DC SQUID-based structure 34 includes a first transformer 62 with a first primary winding 64 and a first secondary winding 66, a second transformer 68 with a second primary winding 70 and a second secondary winding 72, a first SQUID $JJ_{SQ1}$ 74, and a second SQUID $JJ_{SQ2}$ 76. In one embodiment, the first primary winding 64 and the second primary winding 70 are connected in series between the input node $N_{IN}$ of the RQL inverter 32 and ground, such that current may flow between the input node $N_{IN}$ of the RQL inverter 32 and ground and through the first primary winding 64 and the second primary winding 70. The first secondary winding 66 and the first SQUID $JJ_{SQ1}$ 74 are connected in series between a first node $N_{SQ1}$ and a second node $N_{SQ2}$ of the DC SQUID-based structure 34. The second secondary winding 72 and the second SQUID $JJ_{SQ2}$ 76 are also connected in series between the first node $N_{SQ1}$ and the second node $N_{SQ2}$ of the DC SQUID-based structure 34. As such, the first secondary winding 66 and the first SQUID $JJ_{SQ1}$ 74 are parallel with the second secondary winding 72 and the second SQUID $JJ_{SQ2}$ 76 between the first node $N_{SQ1}$ and the second node $N_{SQ2}$ of the DC SQUID-based structure 34. Herein, the first secondary winding 66 and the second secondary winding 72 are connected at the first node $N_{SQ1}$ of the DC SQUID-based structure 34, while the first SQUID $JJ_{SQ1}$ 74 and the second SQUID $JJ_{SQ2}$ 76 are connected at the second node $N_{SQ2}$ of the DC SQUID-based structure 34. The first secondary winding 66, the second secondary winding 72, the second SQUID $JJ_{SQ2}$ 76, and the first SQUID $JJ_{SQ1}$ 74 form a closed loop Lp. For different applications, the first transformer 62 and the second transformer 68 may have a same size or different sizes. The first transformer 62 and the second transformer 68 may have a same coupling factor or different coupling factors.

The bias inductor 44 is connected between the inverter bias tap 38 and the first node $N_{SQ1}$ of the DC SQUID-based structure 34, while the pulse generating $JJ_{PULSEGEN}$ 36 is connected between the second node $N_{SQ2}$ of the DC SQUID-based structure 34 and ground. A pulse generating output $OUT_{PULSEGEN}$ is provided at the second node $N_{SQ2}$ of the DC SQUID-based structure 34.

The output JTL buffer 42 is connected to the DC SQUID-based structure 34 at the second node $N_{SQ2}$ so as to receive the pulse generating output $OUT_{PULSEGEN}$. The output JTL buffer 42 is also connected to the output bias tap 40 to receive the output bias signal $B_{OUT}$. In one embodiment, the output JTL buffer 42 includes a first output inductor 78, a second output inductor 80, a third output inductor 82, a first output $JJ_{OUT1}$ 84, and a second output $JJ_{OUT2}$ 86. The first output inductor 78 and the first output $JJ_{OUT1}$ 84 are connected in series between a node $N_{JTL}$ of the output JTL buffer 42 and ground, and the second output inductor 80 and the second output $JJ_{OUT2}$ 86 are also connected in series between the node $N_{JTL}$ of the output JTL buffer 42 and ground. As such, the first output inductor 78 and the first output $JJ_{OUT1}$ 84 are parallel with the second output inductor 80 and the second output $JJ_{OUT2}$ 86 between the node $N_{JTL}$ of the output JTL buffer 42 and ground. The first output inductor 78 and the second output inductor 80 are connected at the node $N_{JTL}$ of the output JTL buffer 42, while the first output $JJ_{OUT1}$ 84 and the second output $JJ_{OUT2}$ 86 are connected at ground. The third output inductor 82 is connected between the output bias tap 40 and the node $N_{JTL}$ of the output JTL buffer 42. The pulse generating output $OUT_{PULSEGEN}$ is received at a connection node of the first output inductor 78 and the first output $JJ_{OUT1}$ 84, which is connected to the second node $N_{SQ2}$ of the DC SQUID-based structure 34. A JTL output $OUT_{JTL}$ is provided at a connection node of the second output inductor 80 and the second output $JJ_{OUT2}$ 86, which is also an output node NOUT of the RQL inverter 32/the output JTL buffer 42.

In the RQL inverter 32, the DC SQUID-based structure 34 and the pulse generating $JJ_{PULSEGEN}$ 36 are configured to achieve the inversion, while the output JTL buffer 42 is configured to propagate signals generated from the pulse generating $JJ_{PULSEGEN}$ 36 to a next circuit stage (not shown). Notice that, to achieve correct inversion functions, the data input $DATA_{IN}$ must arrive in the first primary winding 64 and the second primary winding 70 before the inverter bias signal $B_{INV}$ reaches its max value (see more details in descriptions of FIGS. 4A-4H). In one embodiment, the data input $DATA_{IN}$ may lead the inverter bias signal $B_{INV}$ by 90° in phase. Since the data input $DATA_{IN}$ relies on the driving bias signal $B_{DRI}$, the driving bias signal $B_{DRI}$ may be requested to lead the inverter bias signal $B_{INV}$ by 90° in phase. The inverter bias signal $B_{INV}$ and the output bias signal $B_{OUT}$ may be synchronized in phase.

In addition, the driving JTL buffer 48 in the previous circuit stage 46 and the output JTL buffer 42 may have a similar/same structure, however, corresponding components in each buffer may have different sizes. For instance, the first driving $JJ_{DRI1}$ 58 and the first output $JJ_{OUT1}$ 84 may have different sizes. Furthermore, all JJs within the RQL inverter 32 (i.e., the pulse generating $JJ_{PULSEGEN}$ 36, the first SQUID $JJ_{SQ1}$ 74, the second SQUID $JJ_{SQ2}$ 76, the first output $JJ_{OUT1}$ 84, and the second output $JJ_{OUT2}$ 86) may be shunted JJs.

Figure 3:
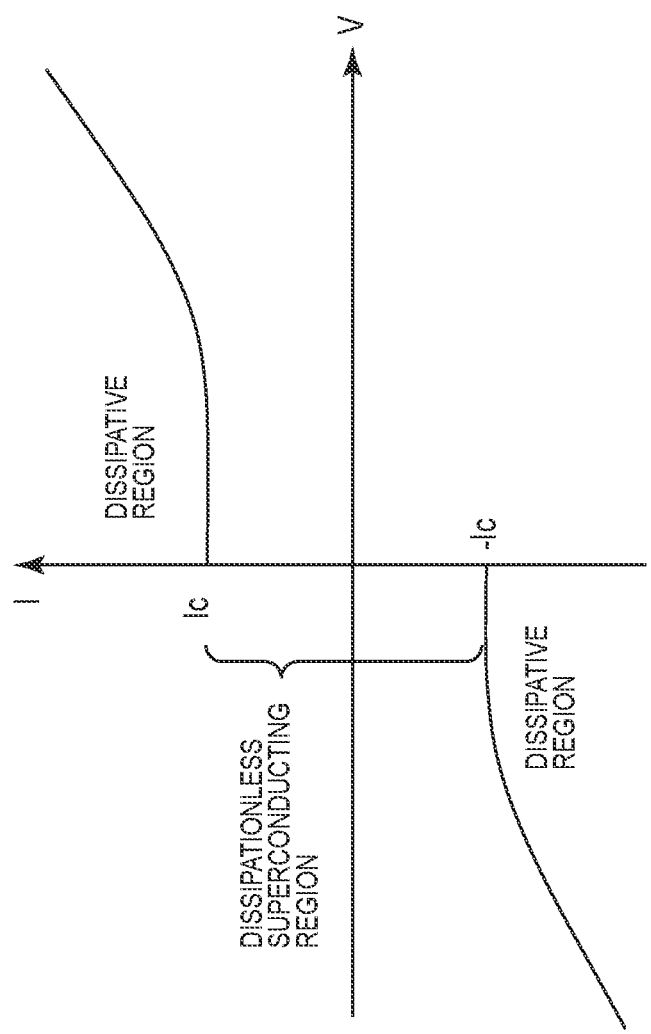
FIG. 3 illustrates current voltage characteristics of one Josephson junction.

FIG. 3 illustrates current voltage characteristics of one JJ (e.g., the pulse generating $JJ_{PULSEGEN}$ 36, the first SQUID $JJ_{SQ1}$ 74, the second SQUID $JJ_{SQ2}$ 76, the first output $JJ_{OUT1}$ 84, or the second output $JJ_{OUT2}$ 86). Typically, the JJ has two current regions, 1) dissipationless superconducting region: when the current through the JJ is within a current range <−critical current $I_C$, +critical current $I_C$>, there is no voltage drop over the JJ; 2) dissipative regions: when the current through the JJ is outside the current range <−$I_C$, $I_C$>, the JJ functions as a normal resistance component and a certain voltage will drop across the JJ.

In RQL, one JJ is considered as being triggered: 1) the current through the JJ exceeds its own positive or negative critical current $I_C$ momentarily, and 2) the JJ operates in the dissipative region momentarily and then returns back to the dissipationless superconducting region. Herein, the JJ only operates in the dissipative region long enough to pass flux into connected loop(s). Once the JJ passes the flux into the connected loop(s), even if the JJ does not operate in the dissipative region anymore, the JJ will keep a switched state (there is a history influence of the flux passing).

In addition, the JJ is considered as being detriggered, 1) when the current through the JJ, compared to a previous triggering situation, exceeds an opposite critical current $I_C$ momentarily (i.e., exceeding the positive critical current previously and exceeding the negative critical current currently), and 2) the JJ operates in an opposite dissipative region momentarily (i.e., operating momentarily in the positive dissipative region in the previous triggering situation and operating momentarily in the negative dissipative region in present situation) and then returns back to dissipationless superconducting region. Herein, the JJ only operates in the opposite dissipative region long enough to pass opposite direction flux into the connected loop(s). If the flux from the previous trigger situation still exists, the opposite direction flux will cancel out the flux from the previous trigger situation. Once the JJ passes the opposite direction flux into the connected loop(s), the JJ will be reset to an original unswitched state (there is no influence of the flux passing in total).

FIGS. 4A-4H show operating phases of the RQL inverter 32 as illustrated in FIG. 2. FIGS. 4A-4D show operating phases of the RQL inverter 32 when the data input $DATA_{IN}$ is at logic state "1". In RQL superconducting digital logic, the data input $DATA_{IN}$ is defined as logic state "1" when a positive and negative single flux quanta (SFQ) pair is presented within a clock cycle, and the data input $DATA_{IN}$ is defined as logic state "0" when no SFQ pair is presented within one clock cycle. As such, the RQL inverter 32 achieves correct inversion functions: 1) when the data input $DATA_{IN}$ presents the positive and negative SFQ pair (logic state "1"), the JTL output $OUT_{JTL}$ presents no SFQ (logic state "0"); and 2) when the data input $DATA_{IN}$ presents no SFQ (logic state "0"), the JTL output $OUT_{JTL}$ presents the positive and negative SFQ pair (logic state "1").

Figure 4A:
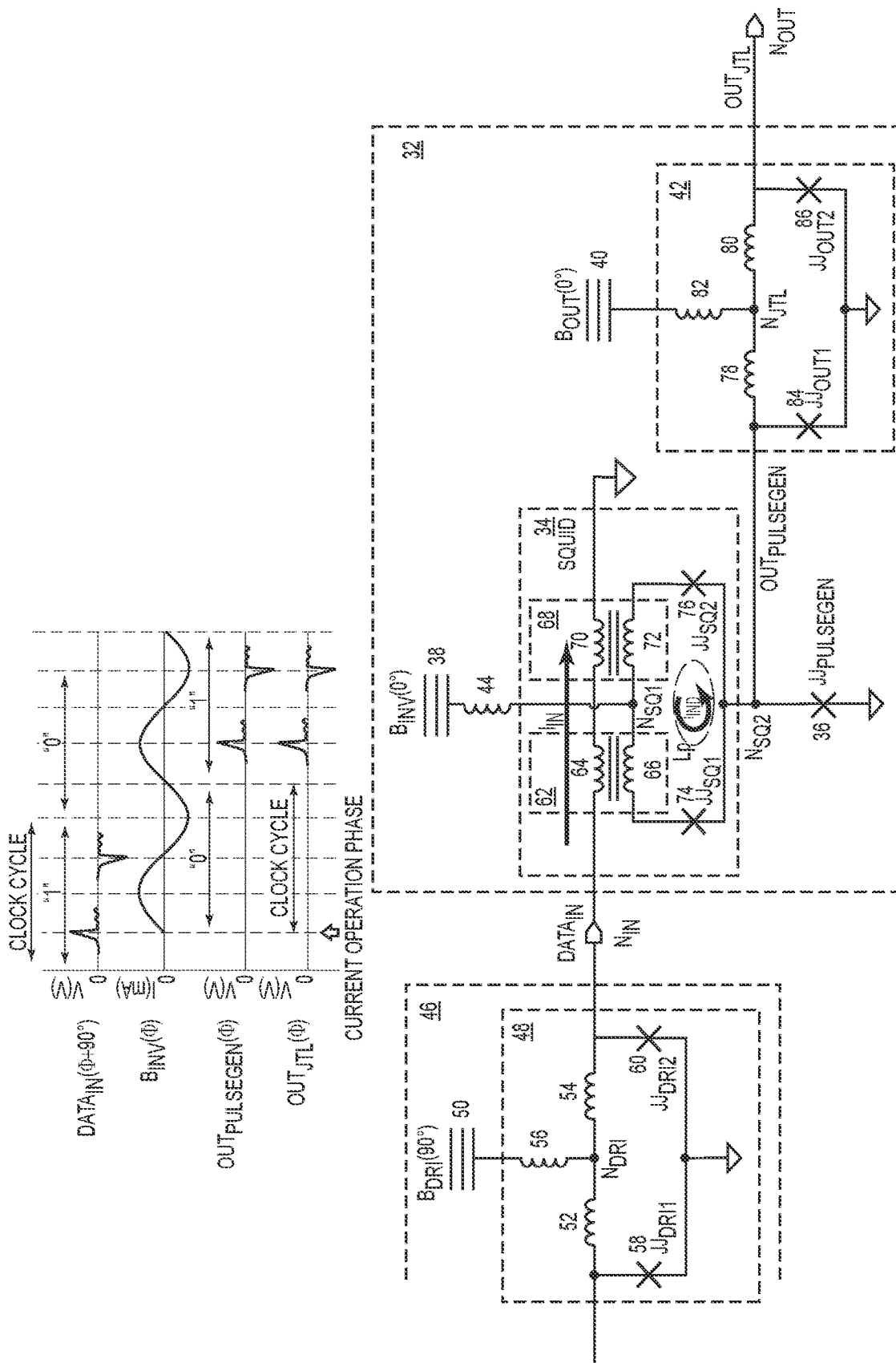
FIGS. 4A-4H show operating phases of the RQL inverter illustrated in FIG. 2.

FIG. 4A shows a first operating phase of the RQL inverter 32, where the driving bias signal $B_{DRI}$ is at a phase of 90°, the inverter bias signal $B_{INV}$ is at a phase of 0°, and the output bias signal $B_{OUT}$ is at a phase of 0°. At such operating phase, the data input $DATA_{IN}$ is positive high (presenting the positive SFQ), and an input current $I_{IN}$ starts to flow from the input node $N_{IN}$ towards ground through the first primary winding 64 of the first transformer 62 and the second primary winding 70 of the second transformer 68. The first and second secondary windings 66 and 72 are coupled to the first and second primary windings 64 and 70, respectively, such that a counterclockwise induced current $I_{IND}$ is formed within the loop Lp due to Lenz' law.

Notice that, the induced current $I_{IND}$ in the loop Lp achieves its max value as soon as the data input $DATA_{IN}$ (i.e., the positive SFQ pulse) arrives the first primary winding 64 and the second primary winding 70. Since the induced current $I_{IND}$ is persistent, the induced current $I_{IND}$ stays about its max value (even after the positive SFQ pulse). The first SQUID $JJ_{SQ1}$ 74 and the second SQUID $JJ_{SQ2}$ 76 are sized so that each does not get triggered by the data input $DATA_{IN}$ itself (e.g., the max value of the induced current $I_{IND}$ is smaller than the critical current of the first SQUID $JJ_{SQ1}$ 74/second $JJ_{SQ2}$ 76). In one embodiment, the first SQUID $JJ_{SQ1}$ 74 and the second SQUID $JJ_{SQ1}$ 76 may have a same size. In another embodiment, the second SQUID $JJ_{SQ1}$ 76 may have a larger size than the first SQUID $JJ_{SQ1}$ 74.

In addition, at the first operating phase of the RQL inverter 32, the inverter bias signal $B_{INV}$ may provide a low current (e.g., close to 0 mA current). There is a very small amount current portion going through the pulse generating $JJ_{PULSEGEN}$ 36, which is much smaller than the critical current of the pulse generating $JJ_{PULSEGEN}$ 36. Hence, the pulse generating $JJ_{PULSEGEN}$ 36 cannot enter its dissipative region. In consequence, there is no signal provided for the pulse generating output $OUT_{PULSEGEN}$ and the JTL output $OUT_{JTL}$. The pulse generating output $OUT_{PULSEGEN}$ and the JTL output $OUT_{JTL}$ stay at logic state "0".

Figure 4B:
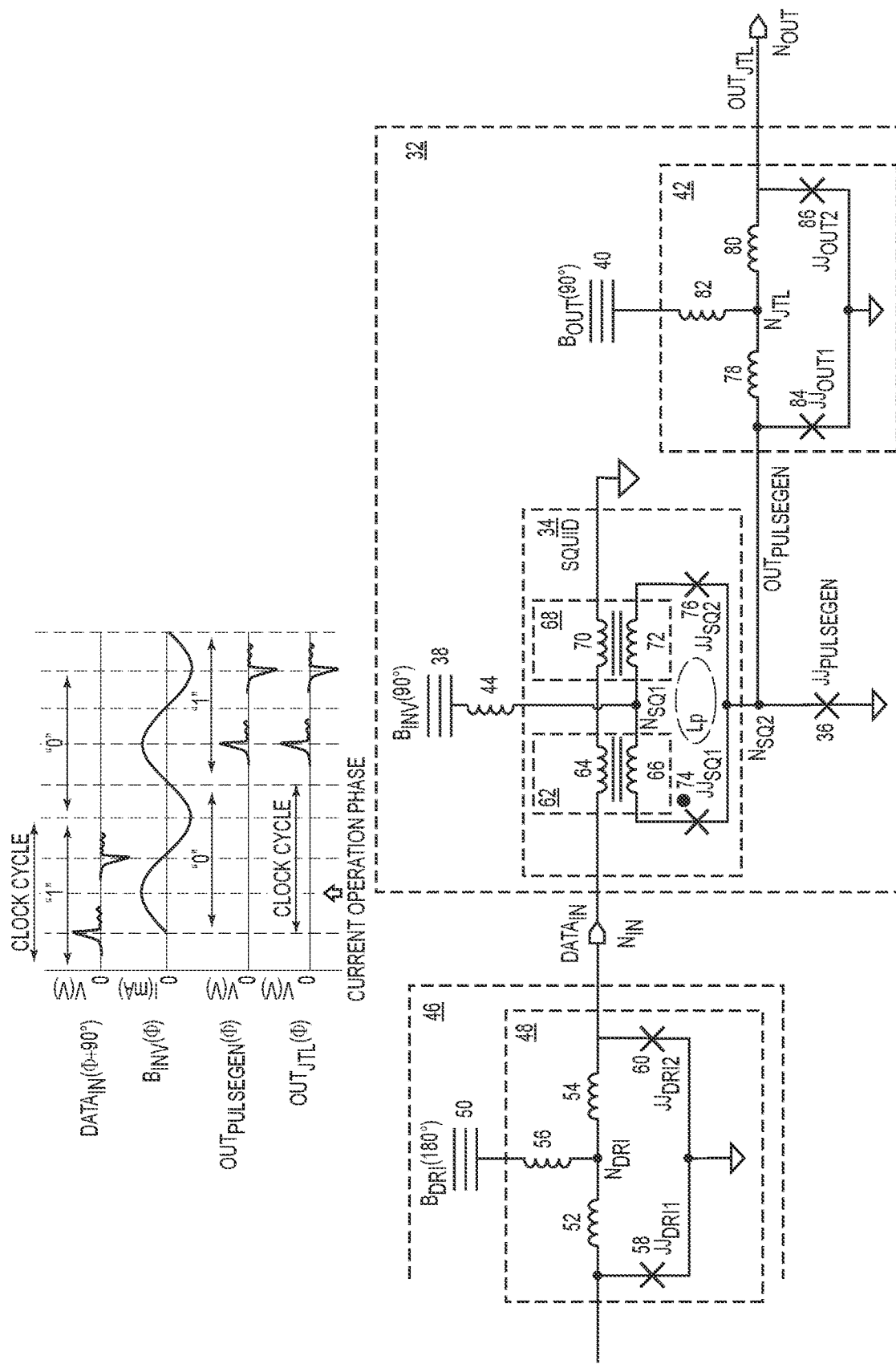

FIG. 4B shows a second operating phase of the RQL inverter 32, where the driving bias signal $B_{DRI}$ is at a phase of 180°, the inverter bias signal $B_{INV}$ is at a phase of 90°, and the output bias signal $B_{OUT}$ is at a phase of 90°. At such operating phase, the induced current $I_{IND}$, which is counterclockwise and induced from the positive SFQ pulse in the data input $DATA_{IN}$, and the inverter bias signal $B_{INV}$, which increases from the phase of 0° to the phase of 90°, flow through the first SQUID $JJ_{SQ1}$ 74 in a same direction. The first SQUID $JJ_{SQ1}$ 74 is able to be triggered by a combination of the induced current $I_{IND}$ and the inverter bias signal $B_{INV}$. For instance, the first SQUID $JJ_{SQ1}$ 74 is triggered when the induced current $I_{IND}$ is persistent around its max value (e.g., the induced current $I_{IND}$ maintains 90% of its max value) and the inverter bias signal $B_{INV}$ approaches to its positive max value (e.g., the inverter bias signal $B_{INV}$ reaches 90% of its positive max value). In addition, since the induced current $I_{IND}$ and the inverter bias signal $B_{INV}$ flow through the second SQUID $JJ_{SQ2}$ 76 in opposite directions, the second SQUID $JJ_{SQ2}$ 76 will not be triggered.

As the first SQUID $JJ_{SQ1}$ 74 is triggered, the first SQUID $JJ_{SQ1}$ 74 passes flux (i.e., one SFQ, causing the critical current of the first SQUID $JJ_{SQ1}$ 74 to be exceeded) into the loop Lp, and the first SQUID $JJ_{SQ1}$ 74 is in a switched state (shown with a black dot beside the component 74). A current from the loop flux pushes upwards to a path of the inverter bias signal $B_{INV}$, thereby lowering the inverter bias signal $B_{INV}$ that flows through the pulse generating $JJ_{PULSEGEN}$ 36. As such, the portion of the inverter bias signal $B_{INV}$ flowing through the pulse generating $JJ_{PULSEGEN}$ 36 is not large enough to trigger the pulse generating $JJ_{PULSEGEN}$ 36, and the pulse generating $JJ_{PULSEGEN}$ 36 remains in the dissipationless superconducting region. In consequence, the pulse generating output $OUT_{PULSEGEN}$ and the JTL output $OUT_{JTL}$ stay at logic state "0".

The first SQUID $JJ_{SQ1}$ 74 and the second SQUID $JJ_{SQ2}$ 76 are sized so that the first SQUID $JJ_{SQ1}$ 74 can be triggered by a combination of the data input $DATA_{IN}$ and the inverter bias signal $B_{INV}$ (i.e., the critical current of the first SQUID $JJ_{SQ1}$ 74 is smaller than the max value of the induced current $I_{IND}$ plus the max value of the inverter bias signal $B_{INV}$). The first SQUID $JJ_{SQ1}$ 74 and the second SQUID $JJ_{SQ2}$ 76 are sized so that each does not get triggered by the inverter bias signal $B_{INV}$ alone (i.e., the max value of the inverter bias signal $B_{INV}$ is smaller than the critical current of the first SQUID $JJ_{SQ1}$ 74/second SQUID $JJ_{SQ2}$ 76). The pulse generating $JJ_{PULSEGEN}$ 36 is sized so that it can be triggered by the inverter bias signal $B_{INV}$ alone (e.g., the critical current of the pulse generating $JJ_{PULSEGEN}$ 36 is smaller than the max value of the inverter bias signal $B_{INV}$). A combined size of the first and second SQUID $JJ_{SQ1}$ 74 and $JJ_{SQ2}$ 76 is larger than the size of the pulse generating $JJ_{PULSEGEN}$ 36.

In addition, the first SQUID $JJ_{SQ1}$ 74 and the second SQUID $JJ_{SQ2}$ 76 are sized that besides the induced current $I_{IND}$, an extra current needed to trigger the first SQUID $JJ_{SQ1}$ 74 (critical current of the first SQUID $JJ_{SQ1}$ 74 minus the induced current $I_{IND}$) is smaller than the critical current of the pulse generating $JJ_{PULSEGEN}$ 36. As such, it can be guaranteed that the first SQUID $JJ_{SQ1}$ 74 is triggered before the pulse generating $JJ_{PULSEGEN}$ 36.

Notice that, the data input $DATA_{IN}$ must arrive in the first primary winding 64 and the second primary winding 70 before the inverter bias signal $B_{INV}$ reaches its max value. For instance, if the $B_{INV}$ reaches its max value before the data input $DATA_{IN}$ arrives in the first primary winding 64 and the second primary winding 70, the first SQUID $JJ_{SQ1}$ 74 cannot be triggered. Therefore, the complete inverter bias signal $B_{INV}$ will flow through the pulse generating $JJ_{PULSEGEN}$ 36 and trigger the pulse generating $JJ_{PULSEGEN}$ 36. In consequence, the flux (causing the critical current of the pulse generating $JJ_{PULSEGEN}$ 36 to be exceeded) will be propagated towards the output JTL buffer 42 and the JTL output $OUT_{JTL}$ will be at logic state "1" (presenting an SFQ pulse). The inversion cannot be achieved. As such, the data input $DATA_{IN}$ and its induced current $I_{IND}$ should be prepared and wait for the inverter bias signal $B_{INV}$ to increase to its max value.

Figure 4C:
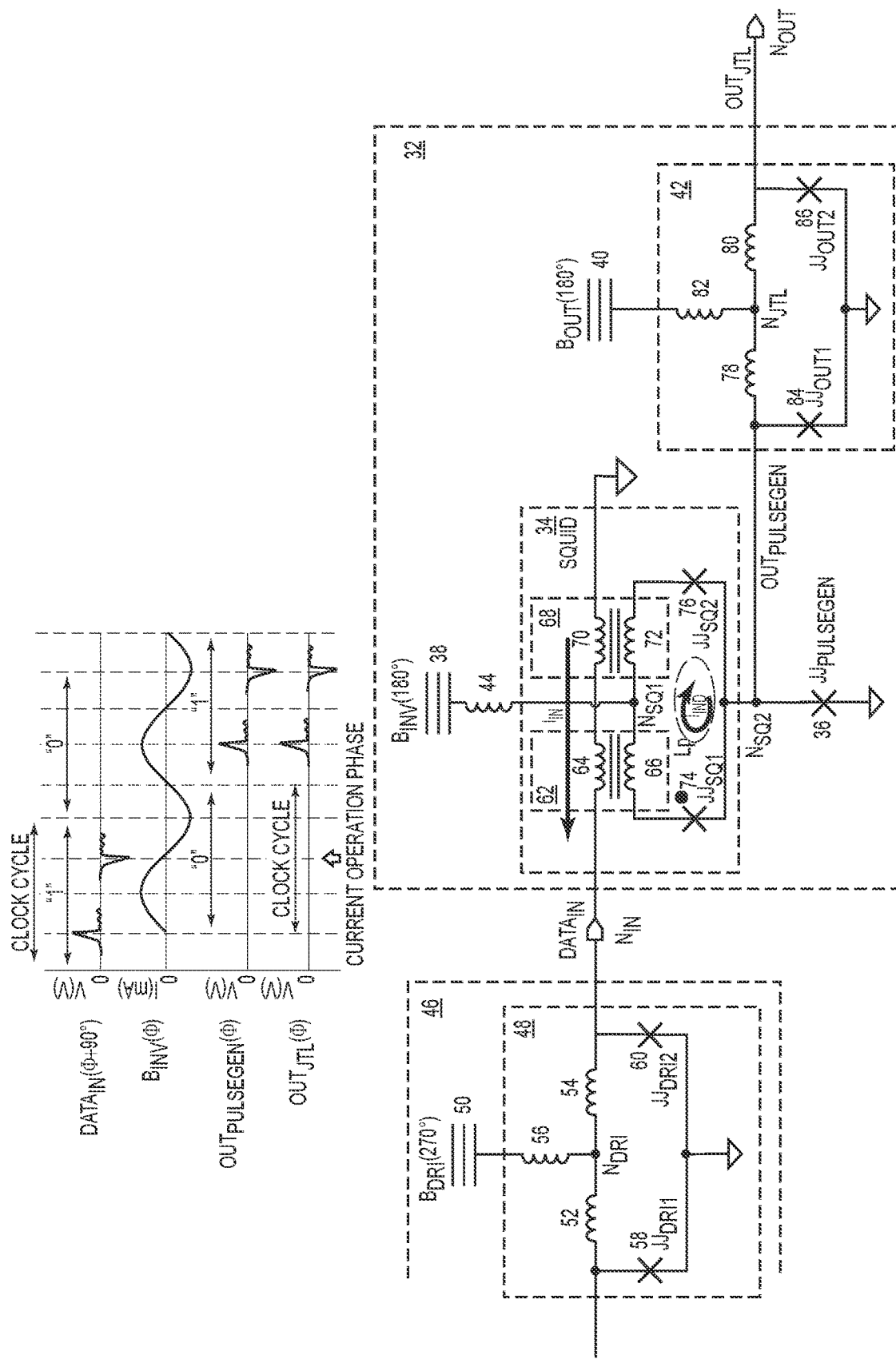

FIG. 4C shows a third operating phase of the RQL inverter 32, where the driving bias signal $B_{DRI}$ is at a phase of 270°, the inverter bias signal $B_{INV}$ is at a phase of 180°, and the output bias signal $B_{OUT}$ is at a phase of 180°. At such operating phase, the data input $DATA_{IN}$ is negative high (presenting the negative SFQ), and the input current $I_{IN}$ starts to flow from ground towards the input node $N_{IN}$ through the second primary winding 70 and the first primary winding 64. The first and second secondary windings 66 and 72 are coupled to the first and second primary windings 64 and 70, respectively, such that the induced current $I_{IND}$ is induced in a clockwise direction within the loop Lp due to Lenz' law.

Notice that, the clockwise induced current $I_{IND}$ in the loop Lp achieves its max value as soon as the data input $DATA_{IN}$ arrives at the first primary winding 64 and the second primary winding 70. In addition, since the induced current $I_{IND}$ is persistent, the induced current $I_{IND}$ stays about its max value (even after the negative SFQ pulse). The clockwise induced current $I_{IND}$ flowing through the first SQUID $JJ_{SQ1}$ 74 is prepared for detriggering the first SQUID $JJ_{SQ1}$ 74. In the third operating phase of the RQL inverter 32, the flux (i.e., one SFQ) remains in the loop Lp and the first SQUID $JJ_{SQ1}$ 74 keeps the switched state.

In addition, at the third operating phase of the RQL inverter 32, the inverter bias signal $B_{INV}$ may provide a low current (e.g., close to 0 mA current). There is a very small amount current portion going through the pulse generating $JJ_{PULSEGEN}$ 36, which is much smaller than the critical current of the pulse generating $JJ_{PULSEGEN}$ 36. Hence, the pulse generating $JJ_{PULSEGEN}$ 36 cannot enter its dissipative region. In consequence, the pulse generating output $OUT_{PULSEGEN}$ and the JTL output $OUT_{JTL}$ stay at logic state "0".

Figure 4D:
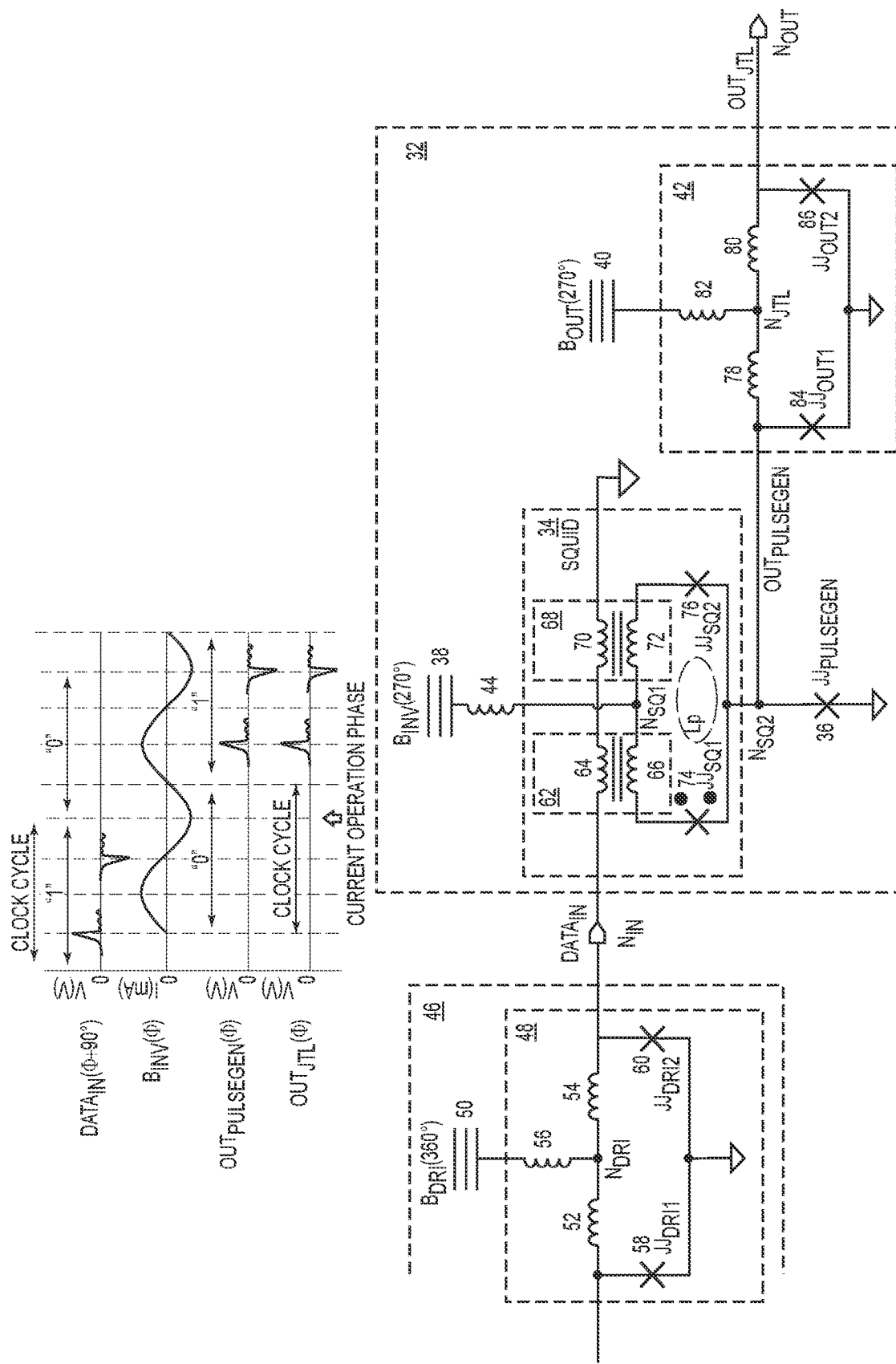

FIG. 4D shows a fourth operating phase of the RQL inverter 32, where the driving bias signal $B_{DRI}$ is at a phase of 360°, the inverter bias signal $B_{INV}$ is at a phase of 270°, and the output bias signal $B_{OUT}$ is at a phase of 270°. At such operating phase, the induced current $I_{IND}$, which is clockwise and induced from the negative SFQ pulse in the data input $DATA_{IN}$, and the inverter bias signal $B_{INV}$, which increases (in the negative region) from the phase of 180° to the phase of 270°, flow through the first SQUID $JJ_{SQ1}$ 74 in a same direction. Combined with the clockwise induced current $I_{IND}$, the inverter bias signal $B_{INV}$ can detrigger the first SQUID $JJ_{SQ1}$ 74. In one embodiment, the first SQUID $JJ_{SQ1}$ 74 is detriggered when the inverter bias signal $B_{INV}$ approaches to its max negative value (e.g., the inverter bias signal $B_{INV}$ reaches 90% of its max negative value).

As the first SQUID $JJ_{SQ1}$ 74 is detriggered, the first SQUID $JJ_{SQ1}$ 74 passes opposite-directional flux (i.e., opposite-directional one SFQ, causing the critical current of the first SQUID $JJ_{SQ1}$ 74 to be exceeded in an opposite direction) into the loop Lp, which cancels out the existing flux in the loop Lp. As such, total flux in the loop Lp returns 0. The first SQUID $JJ_{SQ1}$ 74 is reset to its original unswitched state (shown by two black dots beside the component 74). In addition, the opposite-directional flux lowers the inverter bias signal $B_{INV}$ that flows upward through the pulse generating $JJ_{PULSEGEN}$ 36, and thereby the pulse generating $JJ_{PULSEGEN}$ 36 remains untriggered. In consequence, the pulse generating output $OUT_{PULSEGEN}$ and the JTL output $OUT_{JTL}$ stay at logic state "0".

In the first to fourth operating phases, the data input $DATA_{IN}$ is at logic state "1," while the pulse generating output $OUT_{PULSEGEN}$ and the JTL output $OUT_{JTL}$ stay at logic state "0", and thus inversion is achieved by the RQL inverter 32.

Figure 4E:
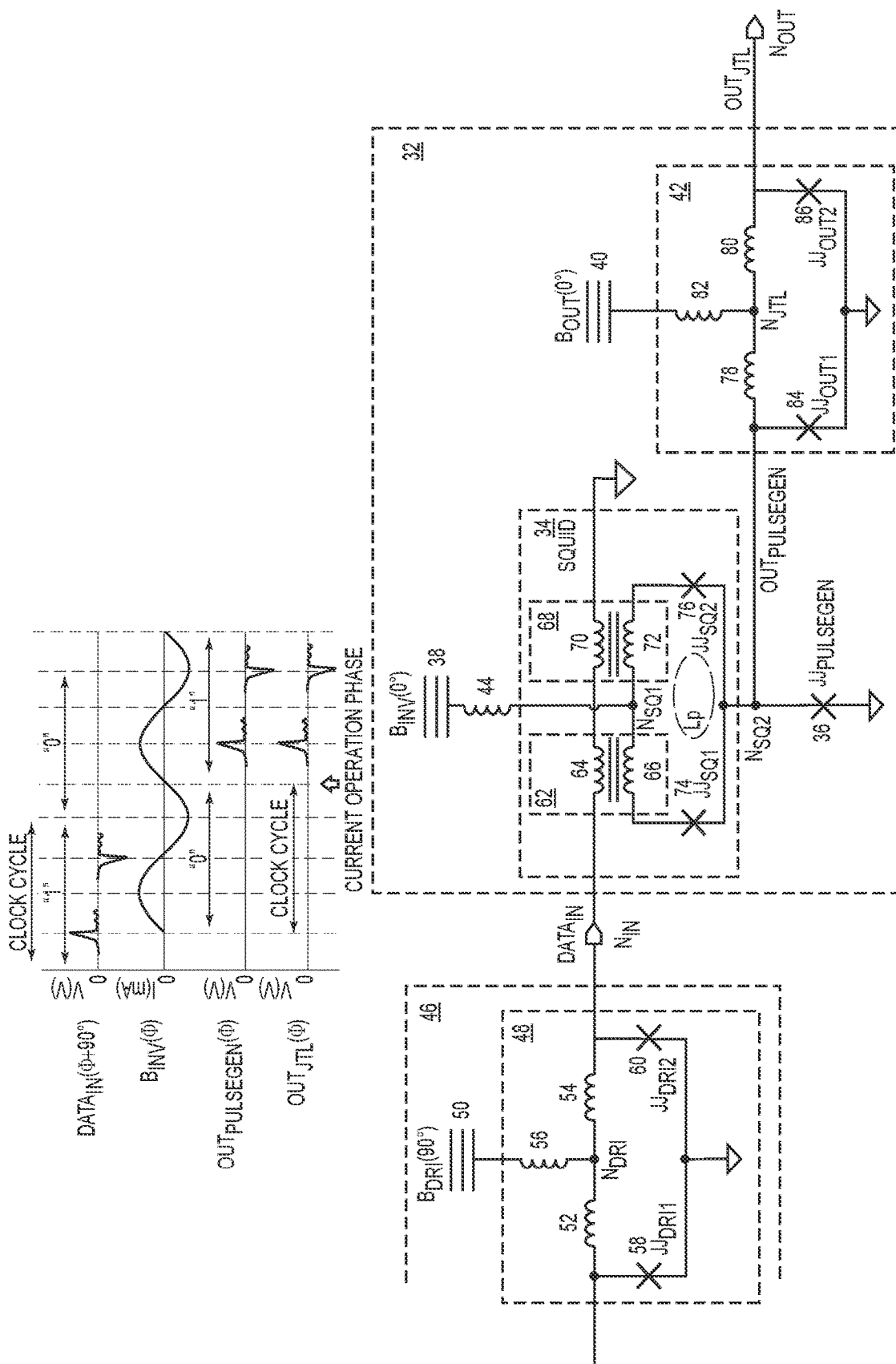

FIGS. 4E-4H show operating phases of the RQL inverter 32 when the data input $DATA_{IN}$ is at logic state "0". FIG. 4E shows a fifth operating phase of the RQL inverter 32, where the driving bias signal $B_{DRI}$ is at a phase of 90°, the inverter bias signal $B_{INV}$ is at a phase of 0°, and the output bias signal $B_{OUT}$ is at a phase of 0°. At such operating phase, the data input $DATA_{IN}$ is 0 or there is no data input $DATA_{IN}$ (presenting no SFQ), and there is no current flowing through the first primary winding 64 of the first transformer 62 and the second primary winding 70 of the second transformer 68. Therefore, there is no induced current within the loop Lp. In addition, at the fifth operating phase of the RQL inverter 32, the inverter bias signal $B_{INV}$ provides a low current (e.g., close to 0 mA current). As such, the first SQUID $JJ_{SQ1}$ 74 cannot be triggered. Furthermore, the inverter bias signal $B_{INV}$ going through the pulse generating $JJ_{PULSEGEN}$ 36 is much smaller than the critical current of the pulse generating $JJ_{PULSEGEN}$ 36. Hence, the pulse generating $JJ_{PULSEGEN}$ 36 cannot be triggered as well. In consequence, no SFQ pulse is provided for the pulse generating output $OUT_{PULSEGEN}$ and the JTL output $OUT_{JTL}$.

Figure 4F:
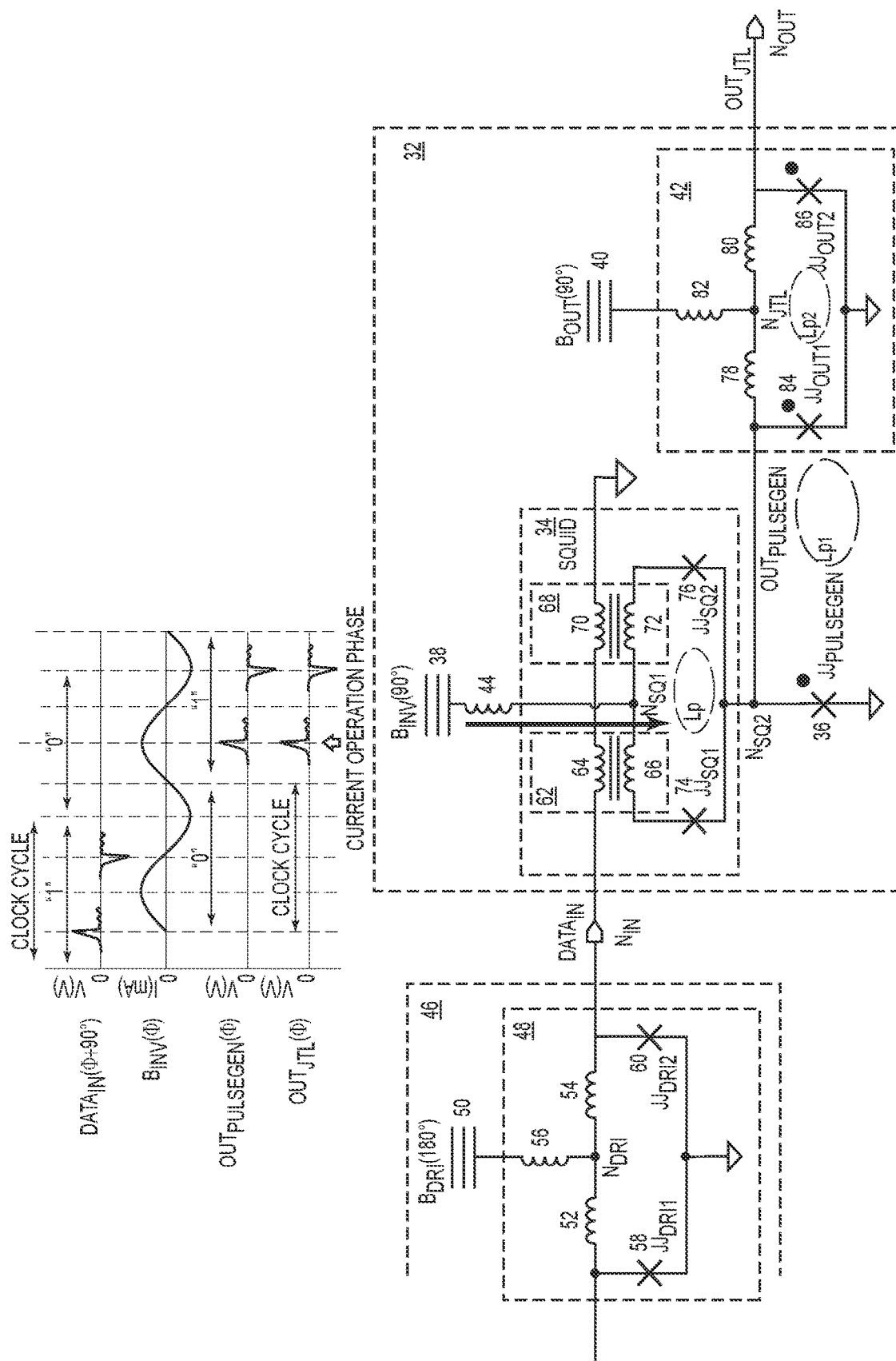

FIG. 4F shows a sixth operating phase of the RQL inverter 32, where the driving bias signal $B_{DRI}$ is at a phase of 180°, the inverter bias signal $B_{INV}$ is at a phase of 90°, and the output bias signal $B_{OUT}$ is at a phase of 90°. At such operating phase, the data input $DATA_{IN}$ remains logic state "0" (presenting no SFQ). Since the first SQUID $JJ_{SQ1}$ 74 and the second SQUID $JJ_{SQ2}$ 76 are sized so that each does not get triggered by the inverter bias signal $B_{INV}$ alone, each of the first SQUID $JJ_{SQ1}$ 74 and the second SQUID $JJ_{SQ2}$ 76 keeps untriggered in the sixth operating phase, even if the inverter bias signal $B_{INV}$ reaches its positive max value.

The inverter bias signal $B_{INV}$ increases from the phase of 0° to the phase of 90° and reaches its positive max value at the phase of 90°. Since neither of the first SQUID $JJ_{SQ1}$ 74 and the second SQUID $JJ_{SQ2}$ 76 is triggered, the complete bias signal $B_{INV}$ will goes through the pulse generating $JJ_{PULSEGEN}$ 36. The pulse generating $JJ_{PULSEGEN}$ 36 is triggered when the inverter bias signal $B_{INV}$ reaches near its positive max value (e.g., reaching 90% of its positive max value, as described above, the critical current of the pulse generating $JJ_{PULSEGEN}$ 36 is smaller than the max value of the inverter bias signal $B_{INV}$). Notice that, the combined size of the first and second SQUID $JJ_{SQ1}$ 74 and $JJ_{SQ2}$ 76 must be larger than the size of the pulse generating $JJ_{PULSEGEN}$ 36, so as to ensure that the pulse generating $JJ_{PULSEGEN}$ 36 can be triggered by the inverter bias signal $B_{INV}$ alone but the first/second SQUID $JJ_{SQ1}/JJ_{SQ2}$ 76 cannot be triggered by the inverter bias signal $B_{INV}$ alone.

Herein, the pulse generating $JJ_{PULSEGEN}$ 36 only operates in its positive dissipative region momentarily to generate a positive SFQ pulse for the output $OUT_{PULSEGEN}$ and pass flux (e.g., one SFQ, causing the critical current of the pulse generating $JJ_{PULSEGEN}$ 36 to be exceeded) into a loop $L_{P1}$, which is formed by the pulse generating $JJ_{PULSEGEN}$, the first output $JJ_{OUT1}$ 84, and ground. The pulse generating $JJ_{PULSEGEN}$ 36 is in a switched state (shown with a black dot beside the component 36).

The flux in the loop $L_{P1}$ combined with the output bias signal $B_{OUT}$ triggers the first output $JJ_{OUT1}$ 84. Once the first output $JJ_{OUT1}$ 84 is triggered, it passes the flux (e.g., one SFQ, originally causing the critical current of the pulse generating $JJ_{PULSEGEN}$ 36 to be exceeded) into a loop $L_{P2}$, which is formed by the first output inductor 78, the second output inductor 80, the second output $JJ_{OUT2}$ 86, and the first output $JJ_{OUT1}$ 84. The first output $JJ_{OUT1}$ 84 is in a switched state (shown with a black dot beside the component 84).

The flux in the loop $L_{P2}$ combined with the output bias signal $B_{OUT}$ then triggers the second output $JJ_{OUT2}$ 86 to generate a positive SFQ pulse for the output $OUT_{JTL}$. Once the second output $JJ_{OUT2}$ 86 is triggered, it passes the flux (e.g., one SFQ, originally causing the critical current of the pulse generating $JJ_{PULSEGEN}$ 36 to be exceeded) out of the RQL inverter 32 to a loop in a next circuit stage (not shown). The second output $JJ_{OUT1}$ 86 is in a switched state (shown with a black dot beside the component 86). The flux, which originally causes the critical current of the pulse generating $JJ_{PULSEGEN}$ 36 to be exceeded, immediately propagates through the output JTL buffer 42 and out of the RQL inverter 32.

Figure 4G:
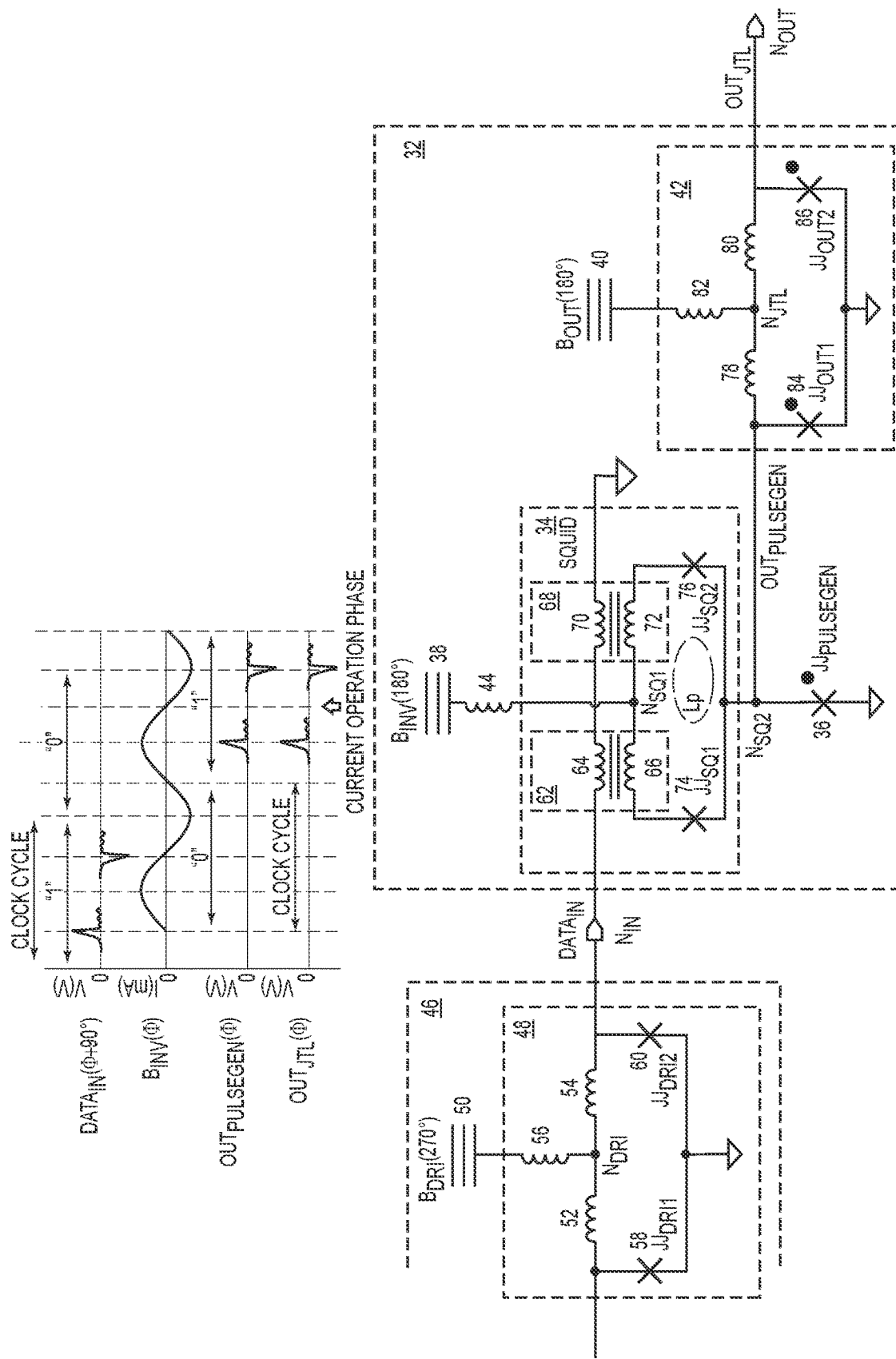

FIG. 4G shows a seventh operating phase of the RQL inverter 32, the driving bias signal $B_{DRI}$ is at a phase of 270°, the inverter bias signal $B_{INV}$ is at a phase of 180°, and the output bias signal $B_{OUT}$ is at a phase of 180°. At such operating phase, the data input $DATA_{IN}$ is still at logic state "0" (presenting no SFQ), and there is no current flowing through the first primary winding 64 and the second primary winding 70. Therefore, there is no induced current within the loop Lp. In addition, at the seventh operating phase, the inverter bias signal $B_{INV}$ provides a low current (e.g., close to 0 mA current). As such, the first SQUID $JJ_{SQ1}$ 74 cannot be triggered. Furthermore, the inverter bias signal $B_{INV}$ going through the pulse generating $JJ_{PULSEGEN}$ 36 is much smaller than the critical current of the pulse generating $JJ_{PULSEGEN}$ 36. Hence, the pulse generating $JJ_{PULSEGEN}$ 36 cannot enter its dissipative region, and there is no additional flux propagating towards the output JTL buffer 42. In consequence, there is no extra SFQ pulse provided for the pulse generating output $OUT_{PULSEGEN}$ and the JTL output $OUT_{JTL}$. In the seventh operating phase, the pulse generating $JJ_{PULSEGEN}$ 36, the first output $JJ_{OUT1}$ 84, and the second output $JJ_{OUT1}$ 86 keep their switched states.

Figure 4H:
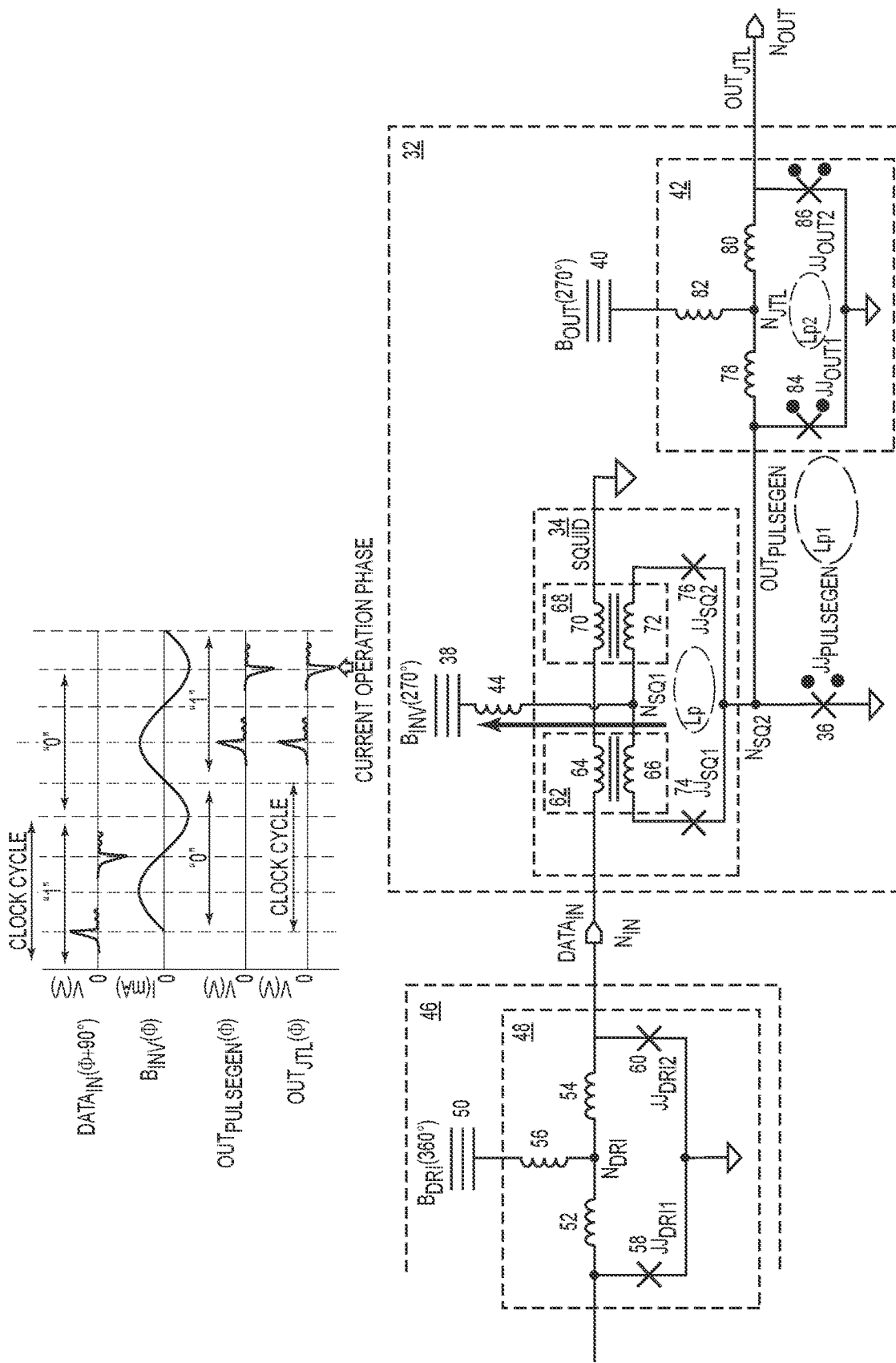

FIG. 4H shows an eighth operating phase of the RQL inverter 32, where the driving bias signal $B_{DRI}$ is at a phase of 360°, the inverter bias signal $B_{INV}$ is at a phase of 270°, and the output bias signal $B_{OUT}$ is at a phase of 270°. At such operating phase, the data input $DATA_{IN}$ remains logic state "0" (presenting no SFQ). Since the first SQUID $JJ_{SQ1}$ 74 and the second SQUID $JJ_{SQ2}$ 76 are sized so that each does not get triggered by the inverter bias signal $B_{INV}$ alone, each of the first SQUID $JJ_{SQ1}$ 74 and the second SQUID $JJ_{SQ2}$ 76 keeps untriggered in the eighth operating phase, even if the inverter bias signal $B_{INV}$ reaches its negative max value.

The inverter bias signal $B_{INV}$ increases (in the negative region) from the phase of 180° to the phase of 270° and reaches its negative max value at the phase of 270°. Since neither of the first SQUID $JJ_{SQ1}$ 74 and the second SQUID $JJ_{SQ2}$ 76 is triggered, the complete bias signal $B_{INV}$ will goes through the pulse generating $JJ_{PULSEGEN}$ 36. The pulse generating $JJ_{PULSEGEN}$ 36 is detriggered when the inverter bias signal $B_{INV}$ reaches near its negative max value (e.g., reaching 90% of its negative max value). As the pulse generating $JJ_{PULSEGEN}$ 36 is detriggered, the pulse generating $JJ_{PULSEGEN}$ 36 passes opposite-directional flux (i.e., opposite-directional one SFQ, causing the critical current of the pulse generating $JJ_{PULSEGEN}$ 36 to be exceeded in an opposite direction) into the loop Lp1, and generates a negative SFQ pulse for the output $OUT_{PULSEGEN}$. The pulse generating $JJ_{PULSEGEN}$ 36 is reset to its original unswitched state (shown by two black dots beside the pulse generating $JJ_{PULSEGEN}$ 36).

The opposite-directional flux in the loop $L_{P1}$ combined with the output bias signal $B_{OUT}$ detriggers the first output $JJ_{OUT1}$ 84. Once the first output $JJ_{OUT1}$ 84 is detriggered, it passes the opposite-directional flux into the loop $L_{P2}$. The first output $JJ_{OUT1}$ 84 is reset to its original unswitched state (shown with two black dots beside the component 84).

The opposite-directional flux in the loop $L_{P2}$ combined with the output bias signal $B_{OUT}$ then detriggers the second output $JJ_{OUT2}$ 86 to generate a negative SFQ pulse for the output $OUT_{JTL}$. Once the second output $JJ_{OUT2}$ 86 is detriggered, it passes the opposite-directional flux out of the RQL inverter 32 to the loop in the next circuit stage (not shown). The second output $JJ_{OUT1}$ 86 is reset to its original unswitched state (shown with two black dots beside the component 86). The opposite-directional flux immediately propagates through the output JTL buffer 42 and out of the RQL inverter 32.

In the fifth to eighth operating phases, the data input $DATA_{IN}$ is at logic state "0", while the pulse generating output $OUT_{PULSEGEN}$ and the JTL output $OUT_{JTL}$ present a positive and negative SFQ within a clock cycle (logic state "1"), and thus inversion is achieved by the RQL inverter 32.

Figure 5A:
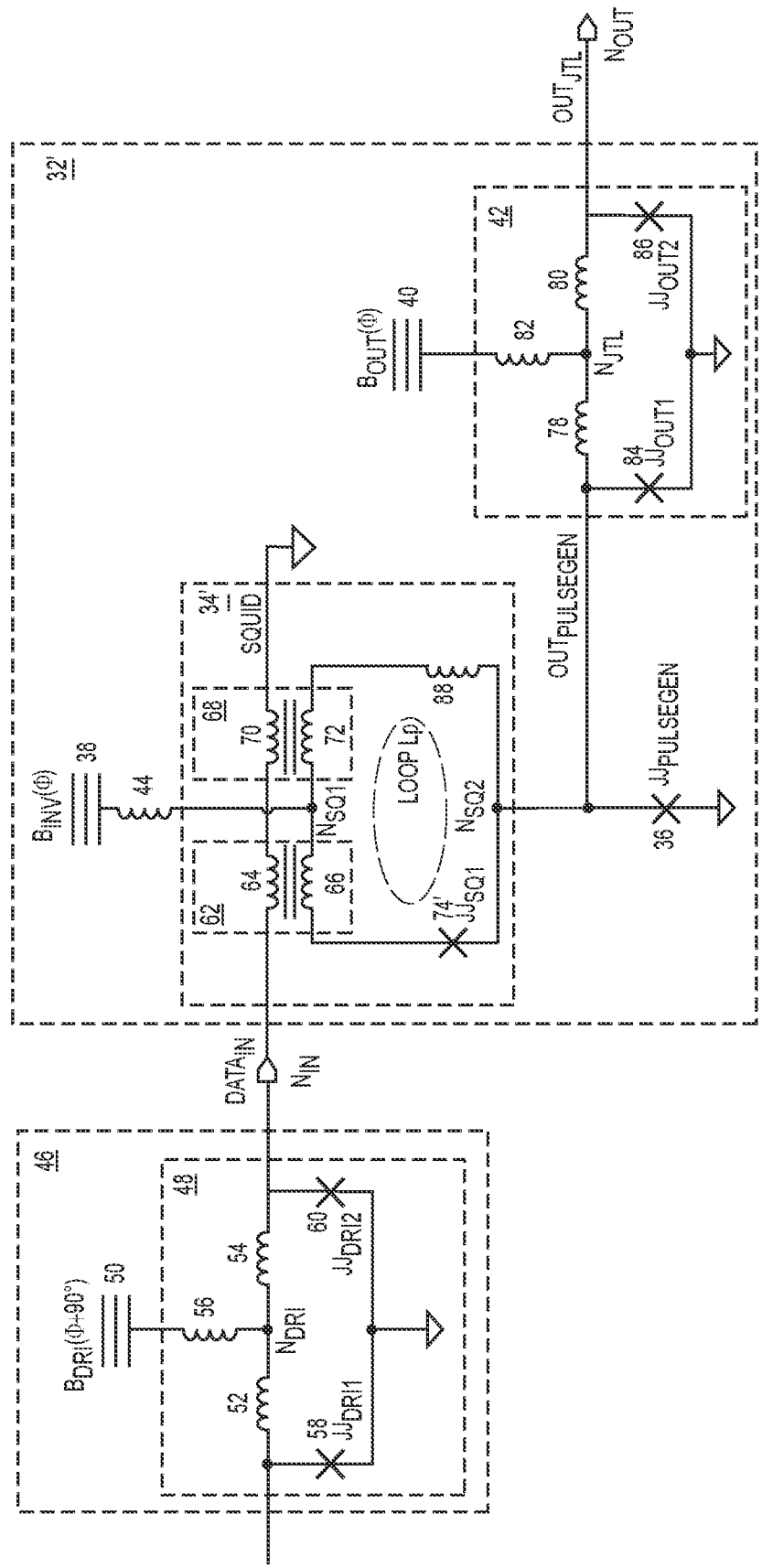
FIGS. 5A-5C illustrate alternative RQL inverters having a radio frequency (RF) SQUID-based structure in series with a pulse generator according to an embodiment of the present disclosure.

During the whole operating process, the second SQUID $JJ_{SQ2}$ 76 is never triggered. The second SQUID $JJ_{SQ2}$ 76 is used for keeping inductance balance of the loop Lp. Therefore, the second SQUID $JJ_{SQ2}$ 76 may be omitted. FIG. 5A shows an alternative RQL inverter 32', which includes a first radio frequency (RF) SQUID-based structure 34' in series with the pulse generator 36 according to one embodiment of the present disclosure. Compared with the DC SQUID-based structure 34, the RF SQUID-based structure 34' has a same structure, except that the RF SQUID-based structure 34' includes only one SQUID $JJ_{SQ}$ 74' instead of two SQUID JJs and replaces the second SQUID $JJ_{SQ2}$ 76 with a SQUID inductor 88. The SQUID inductor 88 is used for balancing inductance in the loop Lp.

The alternative RQL inverter 32' operates similar to the RQL inverter 32. To achieve correct inversion functions, in the alternative RQL inverter 32', the data input $DATA_{IN}$ (as well as the driving bias signal $B_{DRI}$) may need to lead the inverter bias signal $B_{INV}$ by 90° in phase. The inverter bias signal $B_{INV}$ and the output bias signal $B_{OUT}$ may be synchronized in phase. The alternative RQL inverter 32' has similar operations as the RQL inverter 32. When the data input $DATA_{IN}$ is at logic state "0" (i.e., no data input $DATA_{IN}$), the pulse generating $JJ_{PULSEGEN}$ 36 can be triggered/detriggered and propagates flux/opposite-directional flux (e.g., one SFQ, causing the critical current of the pulse generating $JJ_{PULSEGEN}$ 36 to be exceeded) through the output JTL buffer 42. The pulse generating output $OUT_{PULSEGEN}$/JTL output $OUT_{JTL}$ presents a positive and negative SFQ pair within one clock cycle (logic state "1"). When the data input $DATA_{IN}$ is at logic state "1" (i.e., presenting a positive and negative SFQ pair), the SQUID $JJ_{SQ}$ 74' can be triggered/detriggered and passes flux/opposite-directional flux (e.g., one SFQ, causing the critical current of the SQUID $JJ_{SQ}$ 74' to be exceeded) into the loop Lp, thereby preventing the pulse generating $JJ_{PULSEGEN}$ 36 from be triggered. As a result, there is no SFQ pulse provided for the pulse generating output $OUT_{PULSEGEN}$ and the JTL output $OUT_{JTL}$. The pulse generating output $OUT_{PULSEGEN}$ and the JTL output $OUT_{JTL}$ stay at logic state "0", thus inversion is achieved.

Herein, the SQUID $JJ_{SQ}$ 74' is sized so that it does not get triggered by the inverter bias signal $B_{INV}$ alone. The SQUID $JJ_{SQ}$ 74' is sized so that it does not get triggered by the data input $DATA_{IN}$ alone. The SQUID $JJ_{SQ}$ 74' is sized so that the SQUID $JJ_{SQ}$ 74' is able to be triggered with a combination of the data input $DATA_{IN}$ and the inverter bias signal $B_{INV}$. The pulse generating $JJ_{PULSEGEN}$ 36 is sized so that it can get triggered by the inverter bias signal $B_{INV}$ alone.

In addition, the SQUID $JJ_{SQ}$ 74' is sized that besides the induced current $I_{IND}$ (induced by the data input $DATA_{IN}$) in the loop Lp, an extra current needed to trigger the SQUID $JJ_{SQ1}$ 74' (critical current of the SQUID $JJ_{SQ1}$ 74' minus the induced current $I_{IND}$) is smaller than the critical current of the pulse generating $JJ_{PULSEGEN}$ 36. As such, it can be guaranteed that the SQUID $JJ_{SQ1}$ 74' is triggered/detriggered before the pulse generating $JJ_{PULSEGEN}$ 36. In one embodiment, the size of the SQUID $JJ_{SQ}$ 74' may be larger than the size of the pulse generating $JJ_{PULSEGEN}$ 36.

Figure 5B:
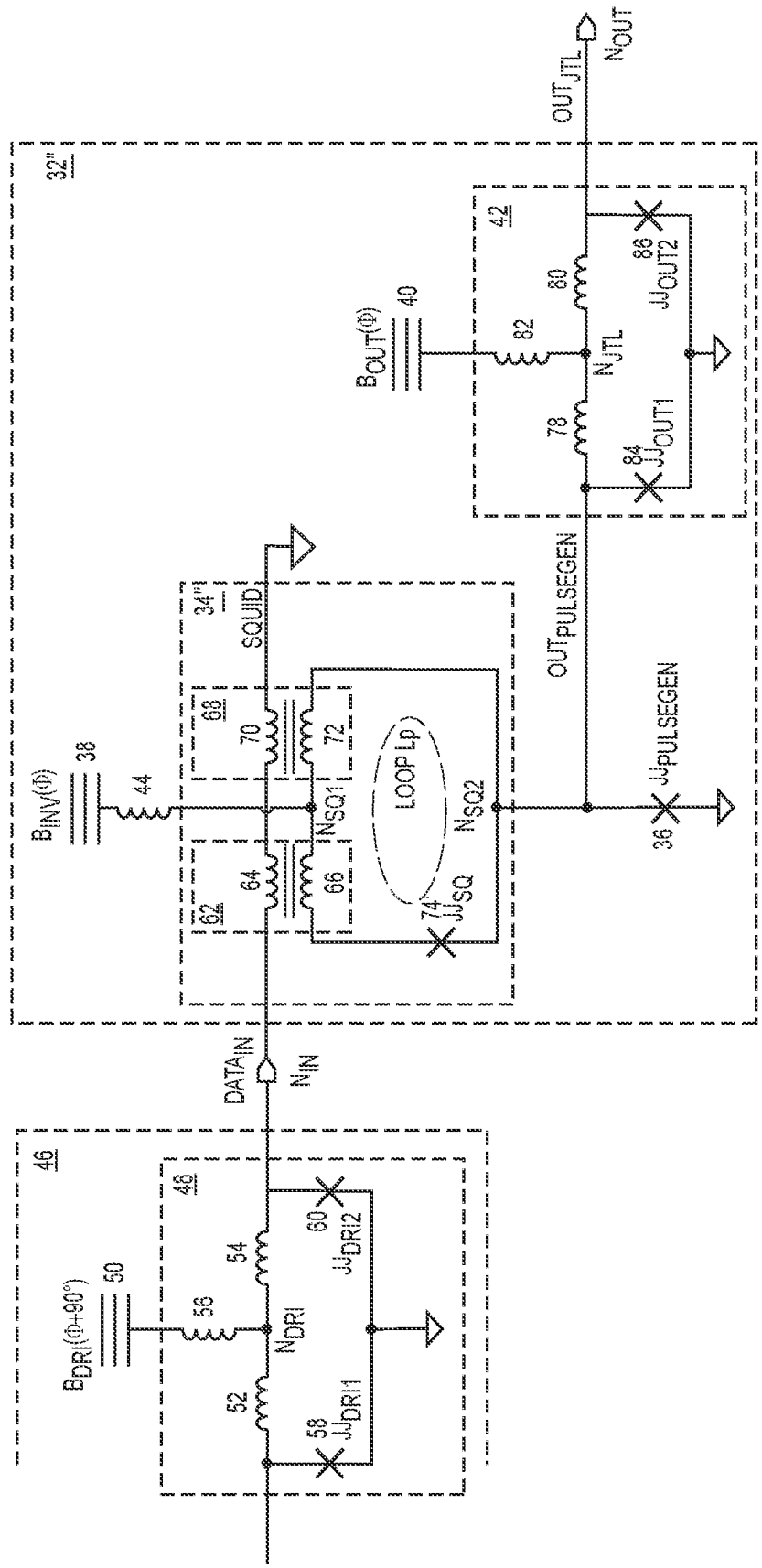

FIG. 5B shows a second alternative RQL inverter 32", which includes a second RF SQUID-based structure 34" in series with the pulse generator 36 according to one embodiment of the present disclosure. Compared with the first RF SQUID-based structure 34', the second RF SQUID-based structure 34" have a same structure, except that the second RF SQUID-based structure 34" omits the SQUID inductor 88. The second alternative RQL inverter 32" operates similarly to the alternative RQL inverter 32'.

Figure 5C:
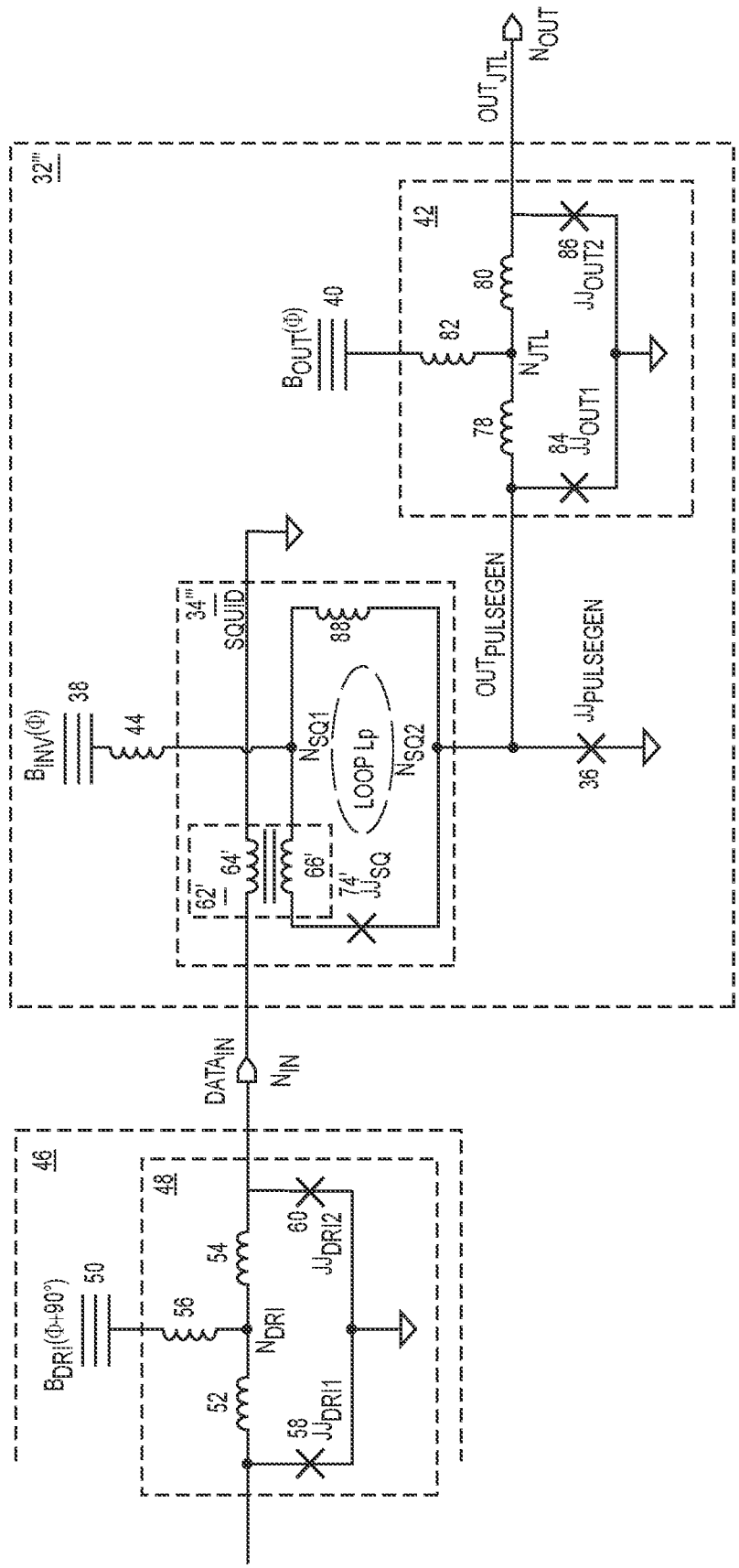

FIG. 5C shows a third alternative RQL inverter 32''', which includes a third RF SQUID-based structure 34''' in series with the pulse generator 36 according to one embodiment of the present disclosure. Compared with the first RF SQUID-based structure 34', the second RF SQUID-based structure 34" have a similar structure. For differences, the third RF SQUID-based structure 34''' includes an alternative first transformer 62' and omits the second transformer 68. Herein, the alternative first transformer 62' includes an alternative primary winding 64' and an alternative secondary winding 66'. In one embodiment, the alternative primary winding 64' is larger than the first primary winding 64 in the first transformer 62 and/or the alternative secondary winding 66' is larger than the secondary primary winding 66 in the first transformer 62. The alternative first transformer 62' is sized so as to provide enough induced current in the loop Lp for triggering the SQUID $JJ_{SQ}$ 74'. The third alternative RQL inverter 32''' operates similar to the alternative RQL inverter 32'.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   an inverter bias tap providing an inverter bias signal;
   a pulse generating Josephson junction (JJ) connected to ground; and
   a superconducting quantum interference device (SQUID) based structure connected between the inverter bias tap and the pulse generating JJ, wherein:
     the SQUID based structure includes a first SQUID JJ and is configured to receive the inverter bias signal from the inverter bias tap and receive a data input from a previous circuit stage, wherein the first SQUID JJ is in a loop of the SQUID based structure;
     when the data input is at logic state "0", the pulse generating JJ is able to be triggered and provide an output signal with a positive and negative single flux quanta (SFQ) pair within one clock cycle; and
     when the data input is at logic state "1", the first SQUID JJ is able to be triggered and pass flux into the loop of the SQUID based structure, thereby preventing the pulse generating JJ from being triggered.

2. The apparatus of claim 1 wherein the inverter bias signal leads the input data by 90° in phase.

3. The apparatus of claim 1 wherein the pulse generating JJ is sized so that it is able to be triggered by the inverter bias signal alone.

4. The apparatus of claim 1 wherein the SQUID based structure further includes a first transformer with a first primary winding and a first secondary winding, wherein:
   the first primary winding is connected between the previous circuit stage and ground, the first secondary winding and the first SQUID JJ are connected in series between the inverter bias tap and the pulse generating JJ, and the pulse generating JJ is connected between the first SQUID JJ and ground;
   the first SQUID JJ and the first secondary winding are in the loop of the SQUID based structure; and
   the output signal is provided at a connection node of the pulse generating JJ and the first SQUID JJ.

5. The apparatus of claim 4 further comprising a bias inductor, wherein the bias inductor is connected between the inverter bias tap and the first secondary winding.

6. The apparatus of claim 4 further comprising an output bias tap and an output Josephson transmission line (JTL) buffer, wherein the output JTL buffer is configured to receive an output bias signal from the output bias tap and propagate the output signal from the SQUID based structure to a next circuit stage.

7. The apparatus of claim 6 wherein the inverter bias signal and the output bias signal are synchronized in phase.

8. The apparatus of claim 6 wherein:
   the output JTL buffer includes a first output inductor, a second output inductor, a third output inductor, a first output JJ, and a second output JJ;
   the first output inductor and the first output JJ are connected in series between a node of the output JTL buffer and ground, and the second output inductor and the second output JJ are connected in series between the node of the output JTL buffer and ground;
   the output signal from the SQUID based structure is received at a connection node of the first output inductor and the first output JJ; and
   the third output inductor is connected between the output bias tap and the node of the output JTL buffer.

9. The apparatus of claim 4 wherein the SQUID based structure is a direct current (DC) SQUID based structure, wherein:
   the SQUID based structure further includes a second SQUID JJ, and a second transformer with a second primary winding and a second secondary winding;
   the first primary winding and the second primary winding are connected in series between the previous circuit stage and ground;
   the second secondary winding and the second SQUID JJ are connected in series between the inverter bias tap and the pulse generating JJ, such that the first secondary winding and the first SQUID JJ are parallel with the second secondary winding and the second SQUID JJ; and
   the first SQUID JJ, the first secondary winding, the second secondary winding, and the second SQUID JJ are in the loop of the SQUID based structure.

10. The apparatus of claim 9 wherein the first SQUID JJ and the second SQUID JJ are sized so that each does not get triggered by the inverter bias signal alone.

11. The apparatus of claim 9 wherein the first SQUID JJ and the second SQUID JJ are sized so that each does not get triggered by the data input alone.

12. The apparatus of claim 9 wherein a combined size of the first SQUID JJ and the second SQUID JJ is larger than a size of the pulse generating JJ.

13. The apparatus of claim 9 wherein the first SQUID JJ and the second SQUID JJ are sized so that the first SQUID JJ is able to be triggered by a combination of the data input and the inverter bias signal, wherein:
   the data input induces an induced current in the loop of the SQUID based structure; and
   a critical current of the first SQUID JJ is smaller than a max value of the induced current plus a max value of the inverter bias signal.

14. The apparatus of claim 13 wherein the first SQUID JJ, the second SQUID JJ, and the pulse generating JJ are sized so that:
   the critical current of the first SQUID JJ minus the induced current is smaller than a critical current of the pulse generating JJ; and
   the critical current of the pulse generating JJ is smaller than the max value of the inverter bias signal.

15. The apparatus of claim 14 wherein the first SQUID JJ is sized so that it does not get triggered by the inverter bias signal alone.

16. The apparatus of claim 14 wherein the first SQUID JJ is sized so that it does not get triggered by the data input alone.

17. The apparatus of claim 14 wherein the first SQUID JJ is sized so that the first SQUID JJ is able to be triggered by a combination of the data input and the inverter bias signal, wherein:
   the data input induces an induced current in the loop of the SQUID based structure; and
   a critical current of the first SQUID JJ is smaller than a max value of the induced current plus a max value of the inverter bias signal.

18. The apparatus of claim 17 wherein the first SQUID JJ and the pulse generating JJ are sized so that:
   the critical current of the first SQUID JJ minus the induced current is smaller than a critical current of the pulse generating JJ; and
   the critical current of the pulse generating JJ is smaller than the max value of the inverter bias signal.

19. The apparatus of claim 4 wherein the SQUID based structure is a radio frequency (RF) SQUID based structure, wherein the first SQUID JJ is the only one JJ in the loop of the SQUID based structure.

20. The apparatus of claim 19 wherein:
   the SQUID based structure further includes a SQUID inductor, and a second transformer with a second primary winding and a second secondary winding;
   the first primary winding and the second primary winding are connected in series between the previous circuit stage and ground;
   the second secondary winding and the SQUID inductor are connected in series between the inverter bias tap and the pulse generating JJ, such that the first secondary winding and the first SQUID JJ are parallel with the second secondary winding and the SQUID inductor; and
   the first SQUID JJ, the first secondary winding, the second secondary winding, and the SQUID inductor are in the loop of the SQUID based structure.

21. The apparatus of claim 19 wherein:
   the SQUID based structure further includes a second transformer with a second primary winding and a second secondary winding;
   the first primary winding and the second primary winding are connected in series between the previous circuit stage and ground;
   the second secondary winding is connected between the inverter bias tap and the pulse generating JJ, such that the first secondary winding and the first SQUID JJ are parallel with the second secondary winding; and
   the first SQUID JJ, the first secondary winding, and the second secondary winding are in the loop of the SQUID based structure.

22. The apparatus of claim 19 wherein:
   the SQUID based structure further includes a SQUID inductor;
   the SQUID inductor is connected between the inverter bias tap and the pulse generating JJ, such that the first secondary winding and the first SQUID JJ are parallel with the SQUID inductor; and
   the first SQUID JJ, the first secondary winding, and the SQUID inductor are in the loop of the SQUID based structure.

* * * * *